United States Patent
Naito

(10) Patent No.: US 10,121,866 B2
(45) Date of Patent: Nov. 6, 2018

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/421,371

(22) Filed: Jan. 31, 2017

(65) Prior Publication Data

US 2017/0236908 A1    Aug. 17, 2017

(30) Foreign Application Priority Data

Feb. 16, 2016  (JP) .................. 2016-027035
Nov. 17, 2016  (JP) .................. 2016-224025

(51) Int. Cl.
H01L 23/58 (2006.01)
H01L 29/36 (2006.01)
G01K 13/00 (2006.01)
H01L 27/06 (2006.01)
H01L 29/739 (2006.01)
G01K 7/01 (2006.01)
H01L 29/32 (2006.01)
H01L 29/861 (2006.01)
H01L 21/22 (2006.01)

(52) U.S. Cl.
CPC .............. H01L 29/36 (2013.01); G01K 7/01 (2013.01); G01K 13/00 (2013.01); H01L 27/0664 (2013.01); H01L 29/32 (2013.01); H01L 29/7395 (2013.01); H01L 29/8613 (2013.01); H01L 21/221 (2013.01)

(58) Field of Classification Search
CPC ..... H01L 33/62; H01L 51/0072; H01L 51/56; H01L 33/60; H01L 2251/558
USPC .......................................... 257/48
See application file for complete search history.

(56) References Cited

U.S. PATENT DOCUMENTS

2006/0255361 A1* 11/2006 Oyabe .................... G01K 7/015
                                                           257/139
2012/0007142 A1*  1/2012 Nagaoka ............... H01L 21/761
                                                           257/140

FOREIGN PATENT DOCUMENTS

JP   2004-363328 A   12/2004
JP   2011-134998 A    7/2011
JP   2015-185742 A   10/2015

* cited by examiner

Primary Examiner — Andy Huynh

(57) ABSTRACT

Provided is a semiconductor device having an RC-IGBT structure, the semiconductor device comprising an FWD (Free Wheel Diode) region and an IGBT (Insulated Gate Bipolar Transistor) region. Provided is a semiconductor device comprising:
a semiconductor substrate; a transistor section formed on the semiconductor substrate; a diode section formed on the semiconductor substrate and including a lifetime killer at a front surface side of the semiconductor substrate;
a gate runner provided between the transistor section and the diode section and electrically connected to a gate of the transistor section.

27 Claims, 22 Drawing Sheets

SEMICONDUCTOR DEVICE

The contents of the following Japanese patent application (s) are incorporated herein by reference:
NO. 2016-027035 filed in JP on Feb. 16, 2016, and
NO. 2016-224025 filed in JP on Nov. 17, 2016.

BACKGROUND

1. Technical Field

The present invention relates to a semiconductor device.

2. Related Art

Conventionally, a semiconductor device having an RC-IGBT structure is known, the structure including an FWD region and an IGBT region formed to be adjacent to each other (for example, Japanese Patent Application Publication No. 2004-363328).

However, in the conventional semiconductor device, a lifetime killer to be injected into the FWD region is also injected into the IGBT region, which may hamper electric properties of the IGBT.

SUMMARY

In a first aspect of the present invention, provided is a semiconductor device comprising: a semiconductor substrate; a transistor section formed on the semiconductor substrate; a diode section formed on the semiconductor substrate and including a lifetime killer at a front surface side of the semiconductor substrate; a gate runner provided between the transistor section and the diode section and electrically connected to a gate of the transistor section.

The semiconductor substrate may include a lifetime killer in at least some regions at the front surface side of the semiconductor substrate and below the gate runner.

The semiconductor substrate may include a lifetime killer in an entire region at the front surface side of the semiconductor substrate and below the gate runner.

The semiconductor substrate may include a lifetime killer in at least a portion at the front surface side of the semiconductor substrate and closer to the transistor section than to the gate runner.

A collector region of the transistor section may be formed in at least a portion below the gate runner.

A collector region of the transistor section may be formed in an entire region below the gate runner.

A collector region of the transistor section may be formed at least a portion closer to the diode section than to the gate runner.

A cathode region of the diode section may not be formed below the gate runner.

The semiconductor device may further comprise a well region having a conductivity type different from that of the semiconductor substrate and formed below the gate runner.

The transistor section may include a gate trench section formed on the front surface of the semiconductor substrate, and at least a portion of the gate trench section may be formed below the gate runner.

The diode section may be arranged at an end portion of an active region of the semiconductor device.

The diode section may be arranged at a corner portion of an active region of the semiconductor device.

The diode section may surround the transistor section in a planar view.

The transistor section may surround the diode section in a planar view.

The semiconductor device may further comprise: a temperature sensor provided adjacent to the transistor section to detect signals in response to a temperature of the transistor section; and a temperature sensor terminal electrically connected to the temperature sensor through a wiring for sensors, to which the signals detected by the temperature sensor are input.

The diode section may include an isolation region to allow at least one of the gate runner and the wiring for sensors to traverse the diode section.

The temperature sensor may be arranged above a well region.

The temperature sensor may be surrounded by the transistor section.

The diode section may include: a first diode region formed at one end of an active region of the semiconductor device; and a second diode region formed at the other end of the active region opposing to the one end.

The temperature sensor may be provided between the first diode region and the second diode region.

The semiconductor device may further comprise: an emitter region of a first conductivity type formed on the front surface of the semiconductor substrate; a base region of a second conductivity type which is different from the first conductivity type formed on the front surface of the semiconductor substrate;

an accumulating layer of the first conductivity type formed at the front surface side of the semiconductor substrate and having a higher concentration than an impurity concentration of the semiconductor substrate; and an interlayer insulating film formed on the front surface of the semiconductor substrate. Also, the interlayer insulating film may include a contact hole corresponding to at least some regions of the emitter region and the base region and formed to penetrate the interlayer insulating film. The accumulating layer may be formed inside a region in which the contact hole is formed in an extending direction of a trench section included in the transistor section.

The accumulating layer may be formed inside a region in which the contact hole is formed in an extending direction of a trench section included in the diode section.

The accumulating layer may be formed in a region in which the transistor section, the diode section and the gate runner are formed.

At least a portion of the accumulating layer may be formed within a well region.

The contact hole at the diode section side may be formed to be apart from a well region in a planar view.

At least a portion of an end portion of a trench section of the transistor section may be formed within a well region.

The summary clause does not necessarily describe all necessary features of the embodiments of the present invention. The present invention may also be a sub-combination of the features described above.

DESCRIPTION OF THE EMBODIMENTS

Hereinafter, the present invention will be described through the embodiments of the invention. However, the embodiments described below are not to limit the claimed inventions. Also, all of all of combinations of features described in the embodiments are not necessarily essential for means for solving the problem of the invention.

Figure 1:
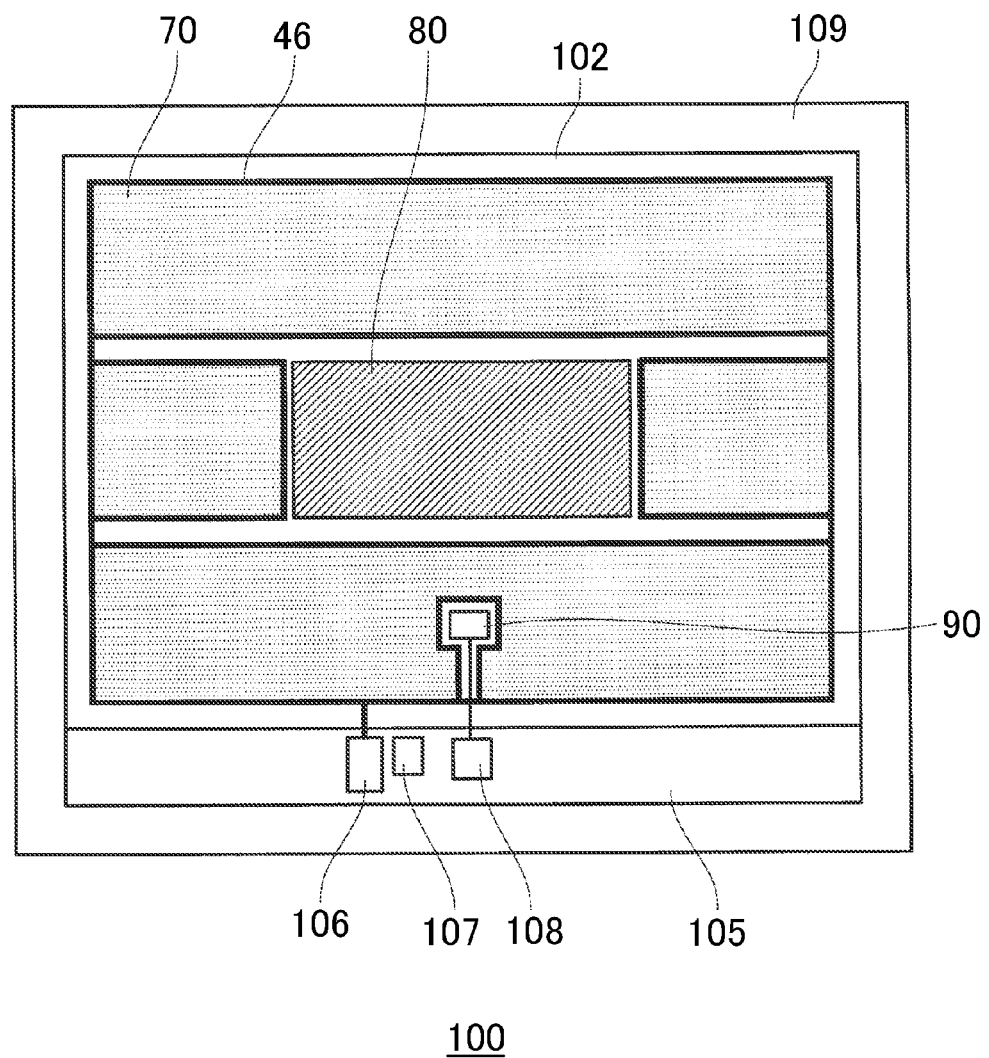
FIG. 1 is a plan view illustrating an exemplary semiconductor device 100 in accordance with Example 1.

FIG. 1 is a plan view illustrating an exemplary semiconductor device 100 in accordance with Example 1. The semiconductor device 100 is a semiconductor chip including a semiconductor substrate on which an active region 102 and an outer region 105 are formed. The semiconductor substrate has a first conductivity type. In the present example, the first conductivity type is described as N type while the second conductivity type as P type. However, the first conductivity type may be P type while the second conductivity type may be N type.

The active region 102 is a region which an electric current flows when the semiconductor device 100 is driven. The active region 102 is provided with a plurality of transistor sections 70 and a diode section 80. Also, the active region 102 may include a temperature sensor 90 adjacent to the transistor section 70 or the diode section 80.

The transistor section 70 includes a transistor such as an IGBT (Insulated Gate Bipolar Transistor). In an example, the transistor section 70 includes a plurality of transistors arranged in a rectangular shape. The plurality of transistors included in the transistor section 70 are connected to one another in electrically parallel. The transistor section 70 has a gate terminal, an emitter terminal and a collector terminal, and the predetermined potential is applied to each terminal, respectively. The transistor section 70 of the present example is formed to cover a surrounding area of the diode section 80.

The diode section 80 includes a diode such as an FWD (Free Wheel Diode). In an example, the diode section 80 includes a plurality of diodes arranged in a rectangular shape. The plurality of diodes included in the diode section 80 are provided in electrically parallel to one another. The diode section 80 has an emitter (or anode) terminal and a cathode terminal, and the predetermined potential is applied to each terminal, respectively.

The temperature sensor 90 is formed above a front surface of semiconductor substrate 10 and detects signals in response to the temperature of the semiconductor device 100. In an example, the temperature sensor 90 includes a PN diode. Preferably, the temperature sensor 90 is provided in the vicinity of the transistor section 70 to detect the temperature of the transistor section 70. However, the temperature sensor 90 may also be provided in the vicinity of the diode section 80.

The outer region 105 is provided outside of the active region 102. Outside of the active region 102 refers to a region which is not surrounded by the active region 102 and is closer to an end portion of the semiconductor substrate 10 than to the center of the active region 102. The outer region 105 may surround the active region 102. The outer region 105 of the present example includes a gate pad 106, a sensing unit 107 and a temperature detecting section 108. Also, a region such as an edge termination region 109 may be provided more outside of the outer region 105.

The gate pad 106 is connected to the transistor section 70 via the gate runner 46. The gate pad 106 sets a gate of the transistor section 70 to a gate potential. The gate of the transistor section 70 refers to, for example, a gate conductive section within the gate trench section 40.

The gate runner 46 is formed to surround an area of the transistor section 70. In particular, the gate runner 46 is formed in a boundary region between the transistor section 70 and the diode section 80, preferably. The gate runner 46 is formed from a conductive material such as polysilicon. The gate runner 46 is connected to the plurality of transistor sections 70 as well as the gate pad 106.

The sensing unit 107 detects an electric current flowing the transistor section 70. In an example, an electric current flowing the sensing unit 107 is in proportion to a main current flowing the transistor section 70 and is smaller than the main current. For example, the sensing unit 107 is connected to the transistor section 70 in parallel and the same gate potential is input to the sensing unit 107 as the transistor section 70. Note that the sensing unit 107 may be connected to a resistor having a greater resistivity than a resistor connected to the transistor section 70.

The temperature detecting section 108 is an exemplary temperature sensor terminal wired to the temperature sensor 90. Signals are input to the temperature detecting section 108 which are detected by the temperature sensor 90 and indicating the temperature of the semiconductor device 100. The temperature detecting section 108 may output the input signals to outside. Also, the semiconductor device 100 may be controlled to be driven based on the temperature detected by the temperature sensor 90. Note that the wiring of the temperature sensor 90 of the present example partially intersects the gate runner 46 in some regions. In such a case, in an example, the gate runner 46 is formed on an insulating film such as a thermally oxidized film on a front surface of the semiconductor substrate while the wiring of the temperature sensor 90 is formed via an insulating film such as an interlayer insulating film above the gate runner 46 such that wiring of the gate runner 46 and the temperature sensor 90 stereoscopically intersects.

The edge termination region 109 reduces concentration of the electric field at the front surface side of the semiconductor substrate. The edge termination region 109 has, for example, a guard ring, a field plate, an RESURF (reduced surface field) and a structure of a combination thereof.

Figure 2:
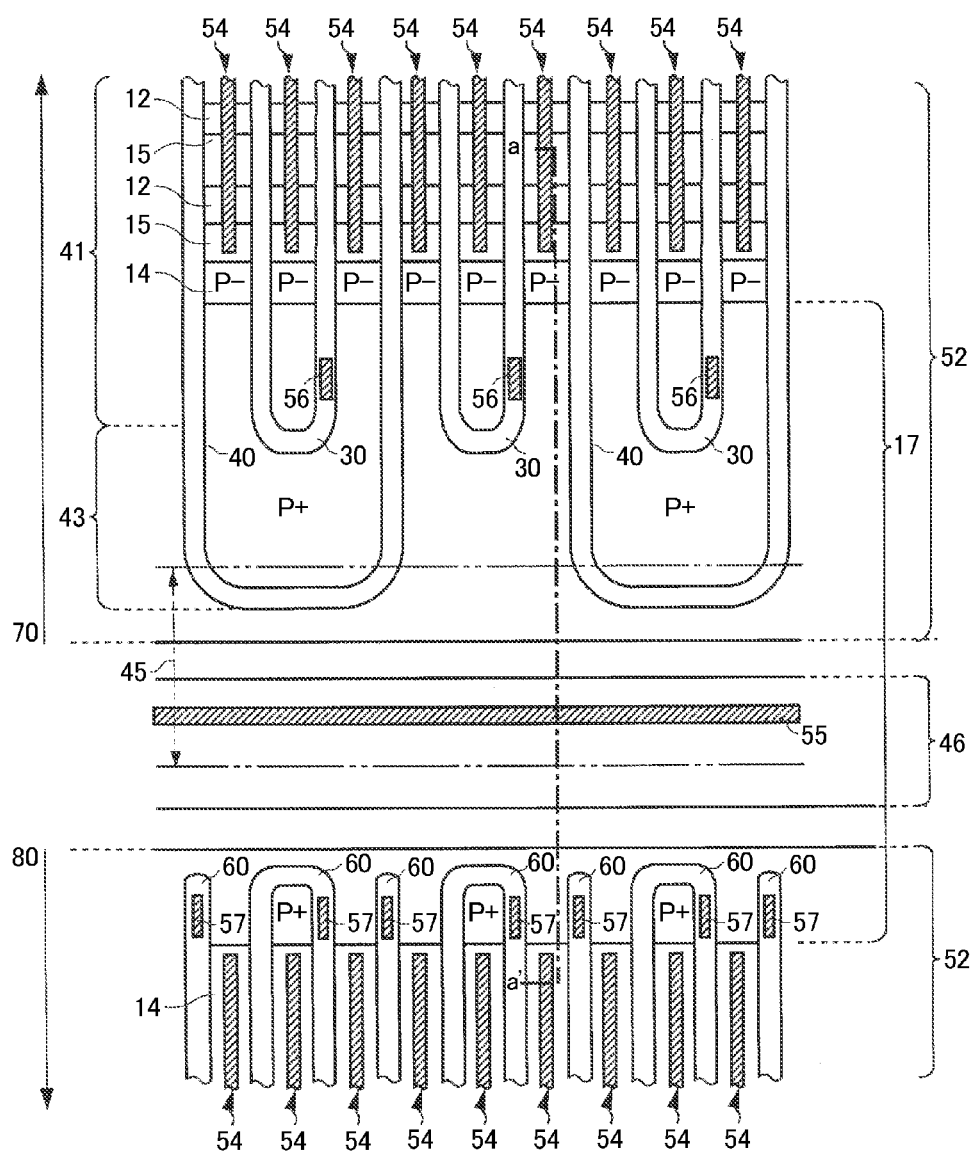
FIG. 2 is an exemplary plan view illustrating the semiconductor device 100 in accordance with Example 1 in more detail.

FIG. 2 is an exemplary plan view illustrating the semiconductor device 100 in accordance with Example 1 in more detail. The semiconductor device 100 of the present example includes, at a front surface side of the chip, a gate runner 46, an emitter electrode 52, a gate trench section 40, a dummy trench section 30, an emitter trench section 60, a well region 17, an emitter region 12, a base region 14, a contact region 15 and contact holes 54, 55, 56, 57.

The gate trench section 40, the dummy trench section 30, the emitter trench section 60, the well region 17, the emitter region 12, the base region 14 and the contact region 15 are formed inside of the semiconductor substrate at the front surface side. Also, the emitter electrode 52 and the gate runner 46 are provided above the front surface of the semiconductor substrate. Note that although an interlayer insulating film is formed between the emitter electrode 52 and the gate runner 46, and the front surface of the semiconductor substrate, it is omitted in FIG. 1.

The contact holes 54, 55, 56, 57 are formed to penetrate the interlayer insulating film formed above the semiconductor substrate. Positioning of the contact holes 54, 55, 56, 57 are not limited to the present example.

The emitter electrode 52 contacts the semiconductor substrate through the contact holes 54, 56, 57. The emitter electrode 52 is formed from a metal-containing material. In an example, at least some regions of the emitter electrode 52 are formed from aluminum-containing metal. The emitter electrode 52 may include a region formed of a tungsten-containing material. The emitter electrode 52 of the present example is provided to correspond to the transistor section 70 and the diode section 80, respectively.

The transistor section 70 refers to a region performing transistor operations.

In the present drawing, although the end of the transistor section 70 is shown as an end of the emitter electrode 52 formed on the region performing the transistor operations for convenience, it can be changed as appropriate.

The diode section 80 refers to a region such as an FWD performing diode operations. In the present drawing, although the end of the diode section 80 is shown as an end of the emitter electrode 52 formed on the region performing the diode operations for convenience, it can be changed as appropriate.

The gate runner 46 is electrically connected to a polysilicon layer 45 underlying the gate runner 46 through the contact hole 55. The gate runner 46 of the present example is connected to the semiconductor substrate via the polysilicon layer 45. The gate runner 46 is formed from a metal-containing material, as is the case with the emitter electrode 52.

The dummy trench section 30 is formed to extend in a predetermined extending direction on the front surface of the semiconductor substrate. One or more dummy trench sections 30 are arranged in a region of the transistor section 70 along a predetermined arrangement direction at a predetermined interval against the gate trench section 40. The shape of the dummy trench section 30 of the present example is a loop type shape having a curved shape at both end portions.

The gate trench section 40 includes an opposing section 41 and a protruding section 43. The opposing section 41 is formed to extend in the extending direction described above in an area in which it is opposing to the dummy trench section 30. That is, the opposing section 41 is formed to be parallel to the dummy trench section 30. The protruding section 43 is formed to further extend from the opposing section 41 in an area in which it is not opposing to the dummy trench section 30. In the present example, two opposing sections 41 provided on both sides of the dummy trench section 30 are connected via one protruding section 43. At least a portion of the protruding section 43 may have a curved shape. The gate trench section 40 of the present example has a loop type shape having the protruding section 43 formed at both ends thereof.

A polysilicon layer 45 is formed to connect the protruding section 43 and the gate runner 46. The protruding section 43 of the present example includes a portion extending in a direction orthogonal to the opposing section 41 in a region most distant from the opposing section 41. At the extending portion of the protruding section 43, a polysilicon layer within the gate trench section 40 and the polysilicon layer 45 are connected. The polysilicon layer 45 is connected to the gate runner 46 via the contact hole 55. The gate runner 46 is connected to the gate pad 106. This allows a gate potential applied to the gate pad 106 from an external circuit or the like to be applied to the polysilicon layer within the gate trench section 40 via the gate runner 46 and the polysilicon layer 45.

The gate trench sections 40 and the dummy trench sections 30 of the present example are arranged alternately in a predetermined arrangement direction. Also, each trench section may be arranged at a constant interval. However, the arrangement of each trench section is not limited to the example above. A plurality of gate trench sections 40 may be arranged between two dummy trench sections 30. Also, the number of the gate trench sections 40 provided between respective dummy trench sections 30 may not be constant.

The contact hole 55 is formed in an interlayer insulating film of a lower portion of the gate runner 46.

The emitter trench section 60 is provided in a region in which the diode section 80 is formed. The emitter trench section 60 may have both a loop type shape and a linear shape. Also, the emitter trench section 60 of the present example is provided to have a trench width corresponding to those of the dummy trench section 30 and the gate trench section 40. However, the shape of the emitter trench section 60 may be changed as appropriate depending on the layout of the transistor section 70 and the diode section 80.

The well region 17 is formed within a predetermined area from the region in which the gate runner 46 is provided. Also, the well region 17 is formed below the gate runner 46.

The well region 17 of the present example is formed to extend toward the transistor section 70 side and the diode section 80 side from the gate runner 46. The well region 17 has a second conductivity type, unlike the semiconductor substrate, if the semiconductor substrate has the first conductivity type.

The contact region 15 on a front surface of the base region 14 is a region of the second conductivity type, having a higher impurity concentration than the base region 14. The contact region 15 of the present example is of P+ type.

The emitter region 12 is selectively formed in the transistor section 70 at a portion of a front surface of the contact region 15 as a region of the first conductivity type having a higher impurity concentration than the semiconductor substrate. The emitter region 12 of the present example is of N+ type. Each of the contact region 15 and the emitter region 12 is formed to extend from one of the adjacent trench sections to the other. One or more contact regions 15 and one or more emitter regions 12 of the transistor section 70 are formed, in a region sandwiched by respective trench sections, to alternately expose along the extending direction of the trench section.

The contact hole 54 is formed above the emitter region 12 and the contact region 15 in the transistor section 70. The contact hole 54 of the present example is formed across the emitter region 12 and the contact region 15. The contact hole 54 may be formed to expose the entire front surface of the emitter regions 12. Also, the contact hole 54 may be formed to also expose the entire front surface of the contact region 15. However, the contact hole 54 is not formed in a region which corresponds to the base region 14 or the well region 17.

Also, the contact hole 54 is formed above the base region 14 and the contact region 15 in the diode section 80. In an example, the contact hole 54 of the transistor section 70 and the contact hole 54 of the diode section 80 have the same length in the extending direction of each trench section.

Note that in the diode section 80 the base region 14 may only include the base region 14 and omit the contact region 15 formed on the front surface thereof. This can inhibit, in the diode section 80, an excessive injection of minority carriers into the drift region 18.

The contact hole 56 is formed above the dummy trench section 30 in the transistor section 70. The contact hole 56 connects the emitter electrode 52 to a dummy conductive section formed within the dummy trench section 30.

The contact hole 57 is formed above the emitter trench section 60 in the diode section 80. The contact hole 57 connects the emitter electrode 52 to a dummy conductive section formed within the emitter trench section 60.

Figure 3:
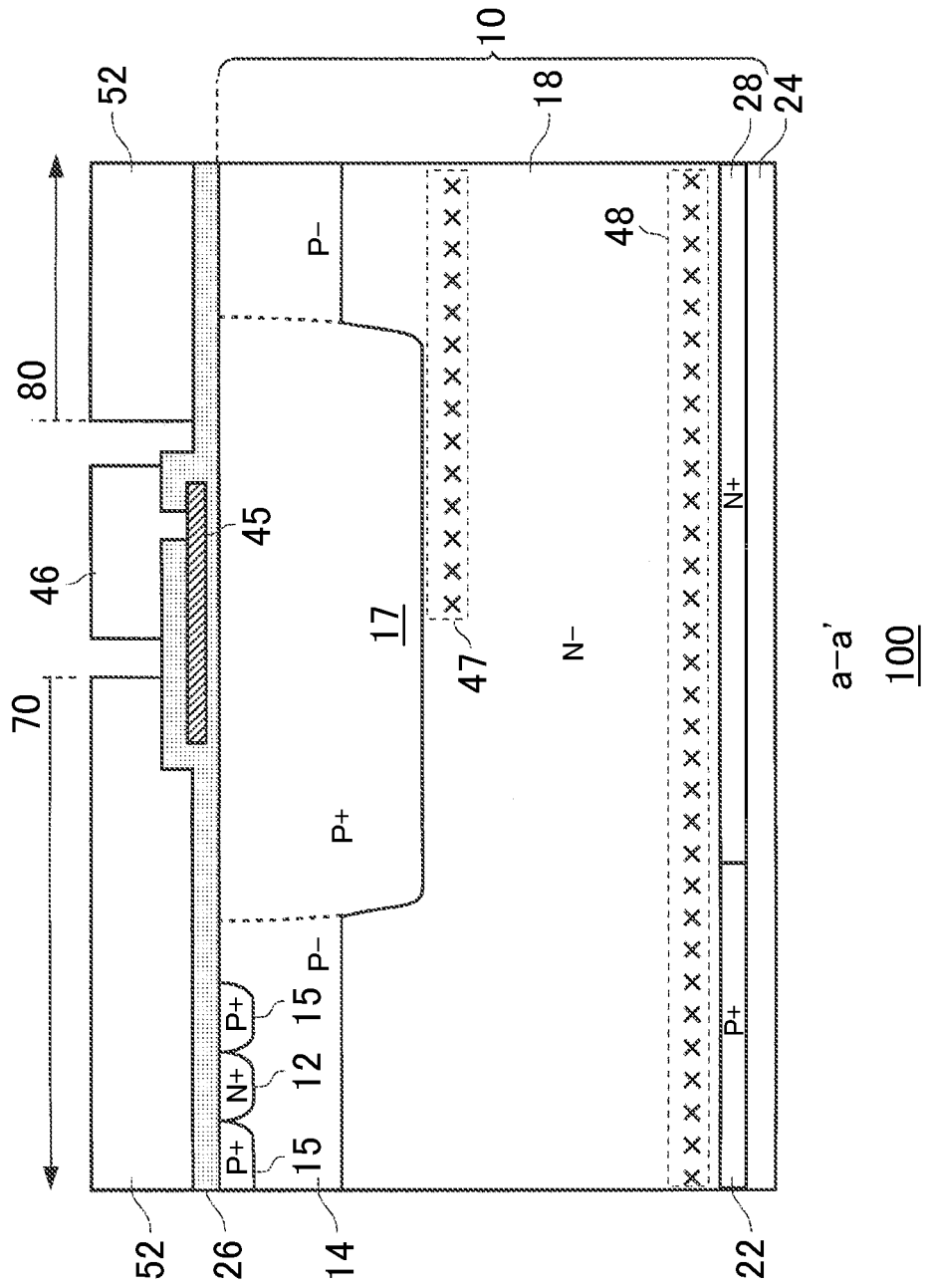
FIG. 3 illustrates an exemplary cross section taken along a-a' of the semiconductor device 100 in accordance with Example 1.

FIG. 3 illustrates an exemplary cross section taken along a-a' of the semiconductor device 100 in accordance with Example 1. The semiconductor device 100 of the present example includes a lifetime killer 47 and a lifetime killer 48 in a drift region 18 of a semiconductor substrate 10. Note that in the present example an interlayer insulating film 26 is illustrated between a gate runner 46 and an emitter electrode 52, and the semiconductor substrate 10.

The lifetime killer 47 is formed at a front surface side of the semiconductor substrate 10 and used to adjust the lifetime of carriers. Forming the lifetime killer 47 can shorten the lifetime of carriers. The lifetime killer 47 is formed by irradiating ion or the like from the front surface side or the back surface side of the semiconductor substrate 10. In an example, the lifetime killer 47 is formed by irradiating helium onto the semiconductor substrate 10. The lifetime killer 47 of the present example is, for example, formed at the anode region side of the diode section 80 to reduce the lifetime of carriers at the anode region side. This results in the semiconductor device 100 reducing a tail current, which can reduce a reverse recovery loss Err.

The lifetime killer 48 is formed at the back surface side of the semiconductor substrate 10 to shorten the lifetime of carriers. The lifetime killer 48 is, for example, irradiated from the back surface side of the semiconductor substrate 10. In an example, the lifetime killer 48 is formed by irradiating helium. For example, if a rated reverse voltage of the semiconductor device 100 is applied, the lifetime killer 48 is formed in a position not in contact with a depletion layer spreading from a boundary between the anode region and the n-type region of the semiconductor substrate 10.

The semiconductor substrate 10 of the present example includes the lifetime killer 47 in at least some regions at the front surface side of the semiconductor substrate 10 and below the gate runner 46. As used herein, below the gate runner 46 refers to a region, in a planar view, in which the gate runner 46 is formed and which is closer to the back surface of the semiconductor substrate 10 than the gate runner 46 is. Note that, as used herein, the planar view refers to a view from the front surface side to the back surface side of the semiconductor substrate 10.

Also, the semiconductor substrate 10 may also include the lifetime killer 47 in at least some regions at the front surface side of the semiconductor substrate 10 and below the well region 17. This can inhibit an excessive injection of minority carriers from the well region 17 of a high impurity concentration to the drift region 18. As used herein, below the well region 17 refers to a region, in a planar view, in which the well region 17 is formed and which is closer to the back surface of the semiconductor substrate 10 than the well region 17 is. Also, the region in which the well region 17 is formed may refer to a region in the front surface of the semiconductor substrate 10 to which dopants are injected to form the well region 17.

The collector region 22 is provided in at least some regions below the gate runner 46. The collector region 22 may be provided in at least some regions below the well region 17. The collector region 22 of the present example is provided in at least some regions below the gate runner 46, which can isolate the transistor section 70 and the cathode region 28. Therefore, the semiconductor device 100 can inhibit a malfunction of the transistor section 70 affected by the cathode region 28.

Comparative Example 1

Figure 4:
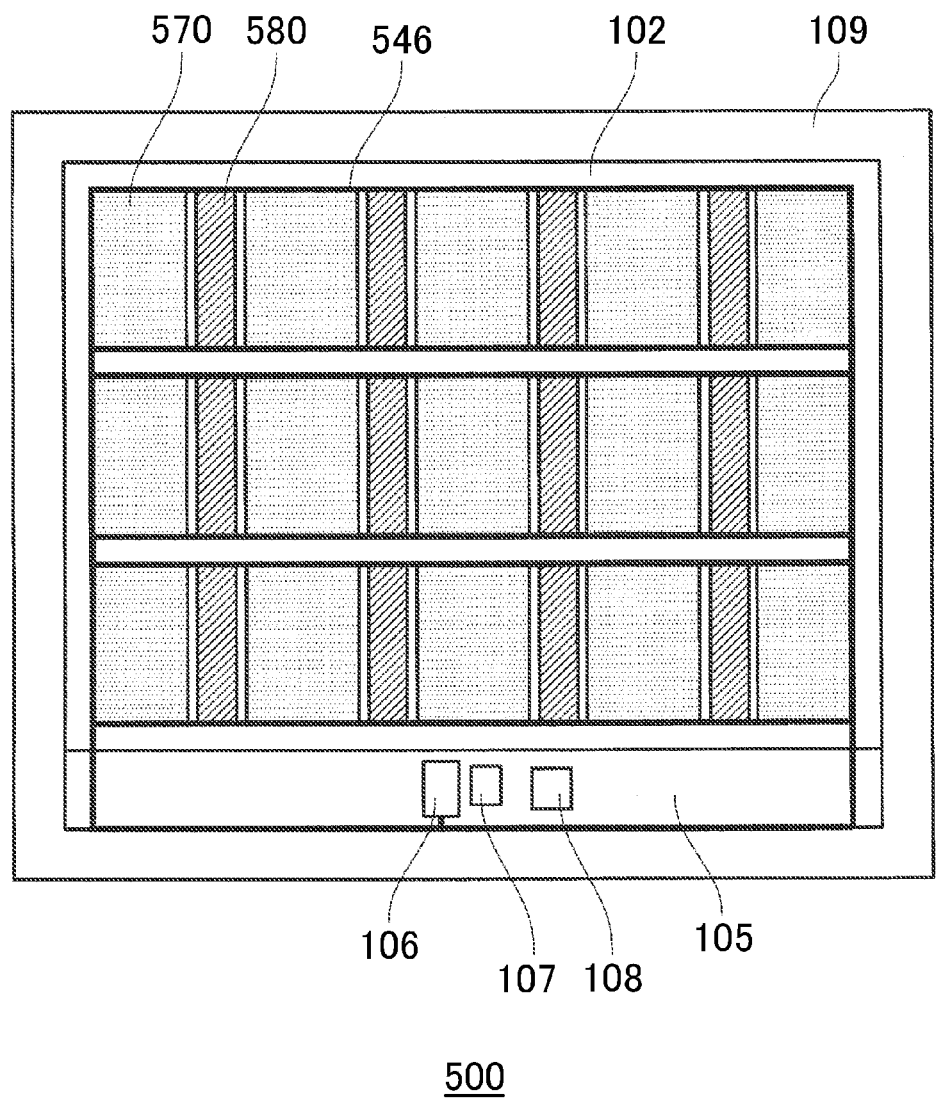
FIG. 4 is a plan view illustrating a configuration of the semiconductor device 500 in accordance with Comparative Example 1.

FIG. 4 is a plan view illustrating a configuration of the semiconductor device 500 in accordance with Comparative Example 1. The semiconductor device 500 of the present example comprises transistor sections 570 and diode sections 580 arranged alternately. Configurations shown by labels in common with the semiconductor device 100 have features similar to those of the semiconductor device 100. The semiconductor device 500 comprises a gate runner 546 to connect the gate terminal 103 and the transistor section 570.

The gate runner 546 is wired to surround the transistor sections 570 and the diode sections 580 arranged alternately. The gate runner 546 of the present example is provided between the transistor sections 570 and between the diode sections 580. Also, the gate runner 546 is formed to surround the transistor section 570 and the diode section 580 collectively. That is, the gate runner 546 of the present example is not provided in a boundary region between the transistor section 570 and the diode section 580.

Figure 5:
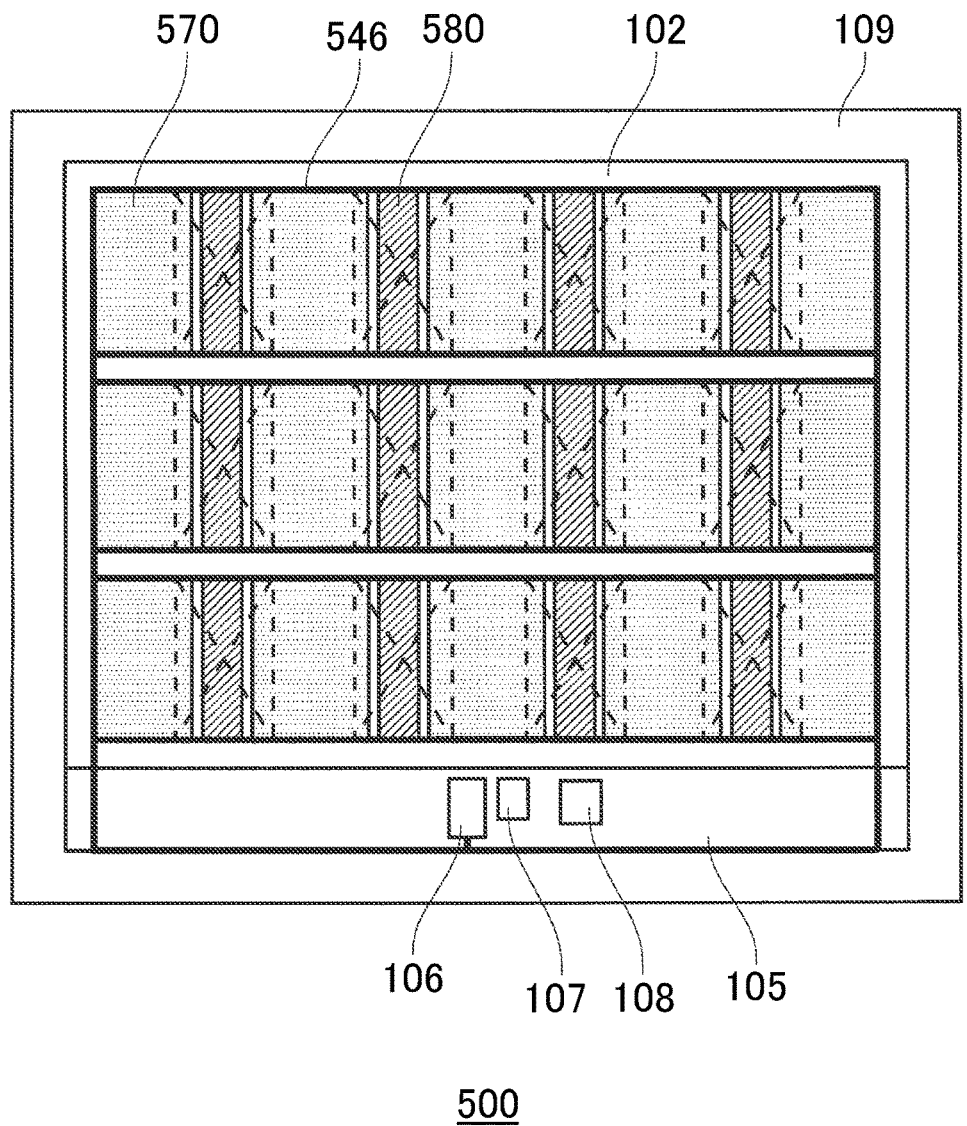
FIG. 5 illustrates a helium irradiation region of the semiconductor device 500 in accordance with Comparative Example 1.

FIG. 5 illustrates a helium irradiation region of the semiconductor device 500 in accordance with Comparative Example 1. Regions shown by dashed lines are irradiated with helium ion at the front surface side of the semiconductor substrate. Helium is irradiated mainly to the diode section 580 and to the surrounding region of the diode section 580. Also, although the front surface side of the transistor section 570 needs not to be irradiated with helium, a boundary region between the transistor section 570 and the diode section 580 may be irradiated with helium to prevent the semiconductor device 500 from malfunction. Therefore, in the semiconductor device 500 of the present example, the transistor section 570 is also irradiated with helium.

Figure 6:
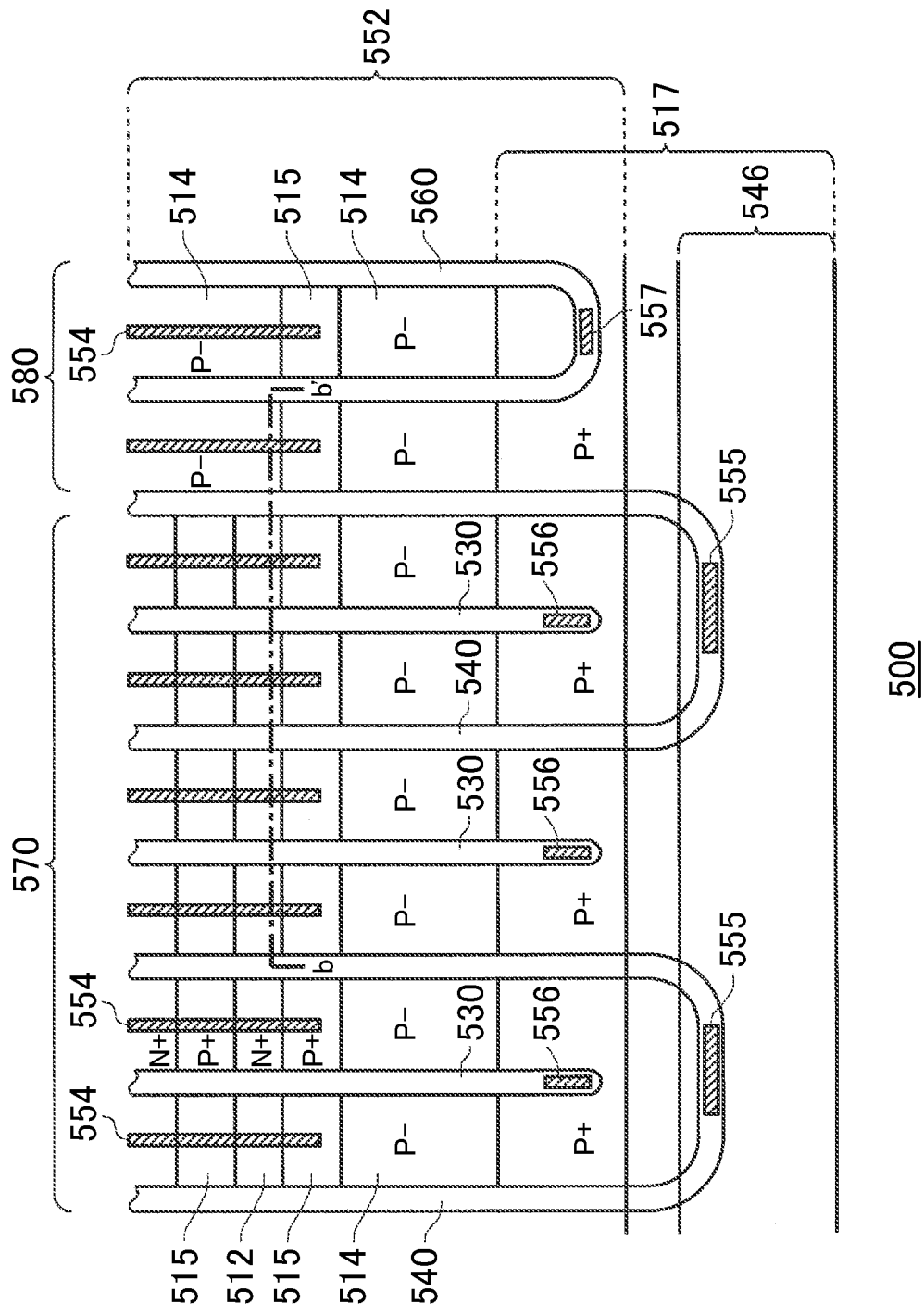
FIG. 6 is a plan view illustrating the semiconductor device 500 in accordance with Comparative Example 1 in more detail.

FIG. 6 is a plan view illustrating the semiconductor device 500 in accordance with Comparative Example 1 in more detail. The semiconductor device 500 of the present example comprises, at a front surface side of a chip, a gate runner 546, an emitter electrode 552, a gate trench section 540, a dummy trench section 530, an emitter trench section 560, a well region 517, an emitter region 512, a base region 514, a contact region 515 and contact holes 554, 555, 556, 557.

The semiconductor device 500 includes a transistor section 570 and a diode section 580 arranged in an arrangement direction. Therefore, a boundary between the diode section 580 and the transistor section 570 is not provided with the gate runner 546. As the gate runner 546 is not provided between the transistor section 570 and the diode section 580, the transistor section 570 and the diode section 580 are formed to be adjacent to each other.

Figure 7:
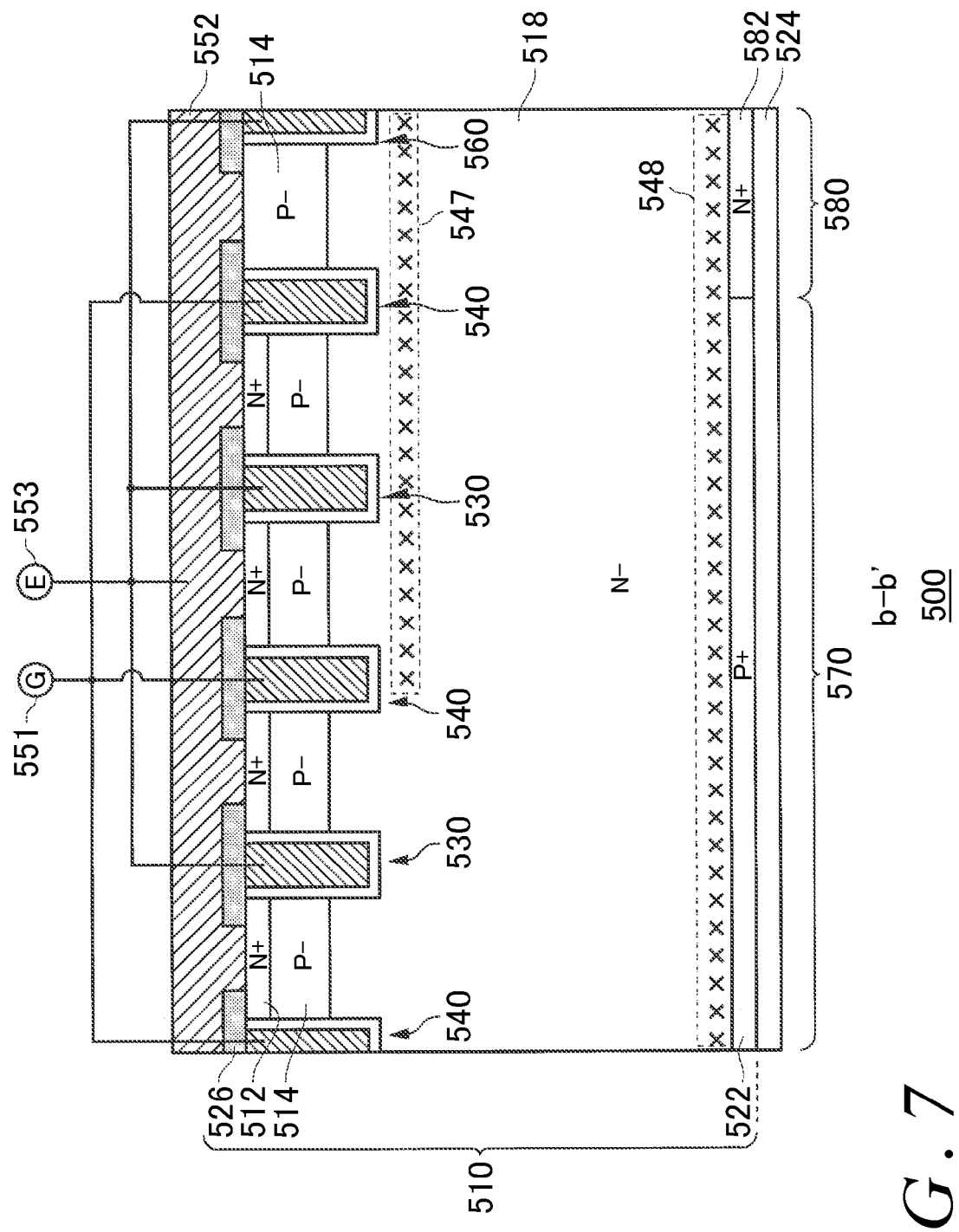
FIG. 7 illustrates an exemplary cross section taken along b-b' of the semiconductor device 500 in accordance with Comparative Example 1.

FIG. 7 illustrates an exemplary cross section taken along b-b' of the semiconductor device 500 in accordance with Comparative Example 1. The semiconductor device 500 comprises a dummy trench section 530, a gate trench section 540, an emitter trench section 560, a collector region 522, a cathode region 582 formed in a semiconductor substrate 510. Also, the semiconductor device 500 includes a collector electrode 524 formed below the semiconductor substrate 510 and an interlayer insulating film 526 and an emitter electrode 552 formed above the semiconductor substrate 510. Note that the gate trench section 540 is connected to a gate terminal 551 while the dummy trench section 530 and the emitter trench section 560 are connected to an emitter terminal 553.

The semiconductor device 500 includes a lifetime killer 547 and a lifetime killer 548 formed in a drift region 518 of the semiconductor substrate 510. The lifetime killer 547 is provided at the front surface side of the semiconductor substrate 510 to correspond to the diode section 580. The lifetime killer 548 is provided at the back surface side of the semiconductor substrate 510 to correspond to the transistor section 570 and the diode section 580.

The semiconductor device 500 of the present example does not include the gate runner 546 between the transistor section 570 and the diode section 580. The semiconductor device 500 also includes the lifetime killer 547 provided at the front surface side of the semiconductor substrate 510 and at the transistor section 570 side to prevent malfunction. The lifetime killer 547 provided at the transistor section 570 side of semiconductor device 500 may deteriorate properties.

Example 2

Figure 8:
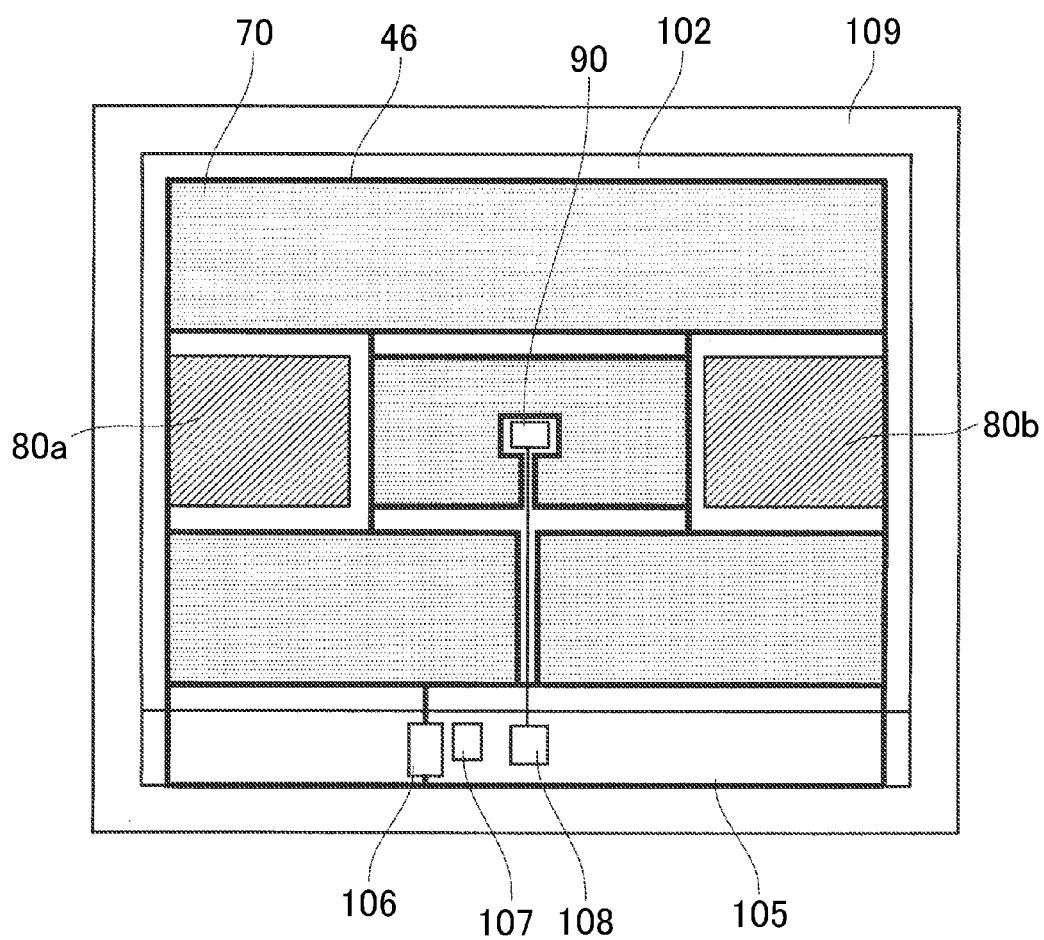
FIG. 8 illustrates an exemplary configuration of a semiconductor device 100 in accordance with Example 2.

FIG. 8 illustrates an exemplary configuration of a semiconductor device 100 in accordance with Example 2. A semiconductor device 100 of the present example comprises two diode sections 80*a*, 80*b* provided at an end portion of an active region 102. The semiconductor device 100 of the present example shows an exemplary arrangement of a transistor section 70, a diode section 80 and a temperature sensor 90, of which an area or the like of each region may be changed as appropriate depending on required properties or the like. For example, the sizes of the transistor section 70 and the diode section 80 are determined to have a predetermined area ratio.

The diode section 80*a* is provided at one end of the active region 102. The diode section 80*b* is provided at the other end different from the one end of the active region 102 at which the diode section 80*a* is provided. The diode section 80*b* of the present example is provided at an end portion of the active region 102 opposing to the one end at which the diode section 80*a* is provided. In this way, the diode section 80 is arranged at the end portion of the active region 102 not to contact the transistor section 70 around the one end of the active region 102. Therefore, the transistor section 70 is less affected by helium with which the diode section 80 is irradiated.

The transistor section 70 is formed in a region in which the diode sections 80*a*, 80*b* are not formed in the active region 102. In an example, the transistor section 70 is arranged to be divided into five regions. The transistor section 70 is provided to be surrounded by the gate runner 46, respectively. Therefore, the gate runner 46 is necessarily formed at the boundary between the transistor section 70 and the diode section 80. This can inhibit deterioration of the properties of the transistor section 70.

The temperature sensor 90 is formed to be surrounded by the transistor section 70. More specifically, the temperature sensor 90 is provided in the vicinity of the center of the active region 102 inside the transistor section 70. This results in the temperature sensor 90 measuring the temperature in a region of the transistor section 70 which is most likely subject to a high temperature. However, the temperature sensor 90 may be provided in a region other than the center of the active region 102 and in the vicinity of the transistor section 70. Also, the temperature sensor 90 may be provided in the vicinity of the diode section 80. The temperature sensor 90 of the present example is arranged between the diode section 80*a* and the diode section 80*b*.

Example 3

Figure 9:
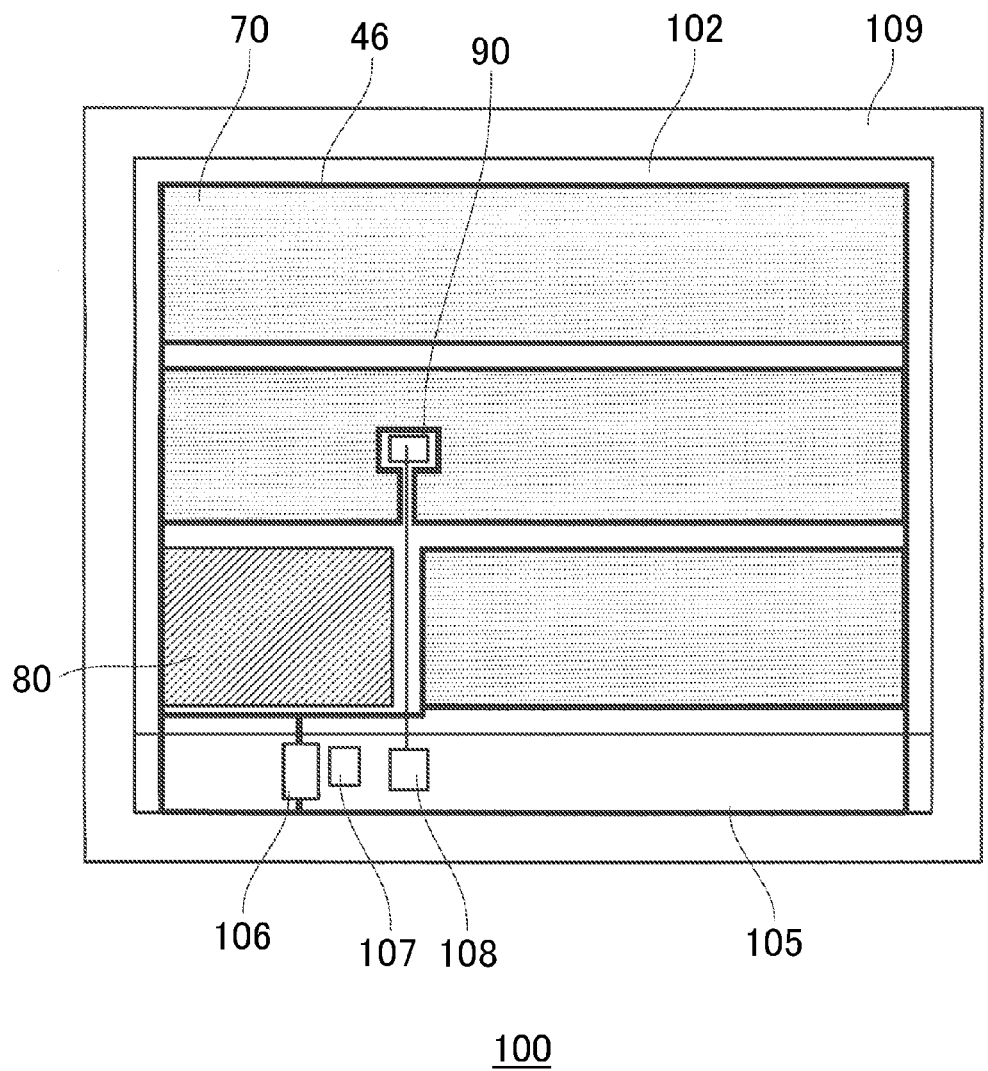
FIG. 9 illustrates an exemplary configuration of a semiconductor device 100 in accordance with Example 3.

FIG. 9 illustrates an exemplary configuration of a semiconductor device 100 in accordance with Example 3. The semiconductor device 100 of the present example shows an exemplary arrangement of a transistor section 70, a diode section 80 and a temperature sensor 90, of which an area or the like of each region may be changed as appropriate depending on required properties or the like.

The diode section 80 is formed at an end portion of an active region 102. In particular, the diode section 80 of the present example is formed at a corner portion of the active region 102. That is, the diode section 80 is arranged to have more regions contact the end portion of the active region 102 to reduce the boundary region between the diode section 80 and the transistor section 70. Therefore, the transistor section 70 is less affected by helium with which the diode section 80 is irradiated.

The transistor section 70 is formed in a region in which the diode section 80 is not formed in the active region 102. The transistor section 70 is provided to be surrounded by the gate runner 46, respectively. Therefore, the gate runner 46 is necessarily formed at the boundary between the transistor section 70 and the diode section 80. This can inhibit deterioration of the properties of the transistor section 70. In particular, as the diode section 80 of the present example is provided at the corner portion of the active region 102, the boundary region includes only two sides which contact the transistor section 70. Therefore, the transistor section 70 is less affected by irradiation of helium.

The temperature sensor 90 is arranged depending on the position of the diode section 80. In an example, the temperature sensor 90 is provided such that its wiring is positioned between the transistor section 70 and the diode section 80. This results in the transistor section 70 having a larger area. Also, in the temperature sensor 90 of the present example, wiring connecting the temperature sensor 90 and a temperature detecting section 108 is provided to be adjacent to one side of the diode section 80. In this way, an invalid region is arranged in a surrounding area of the diode section 80 which does originally not operate as the transistor section 70 such that the transistor section 70 is further less affected by helium with which the diode section 80 is irradiated.

Example 4

Figure 10:
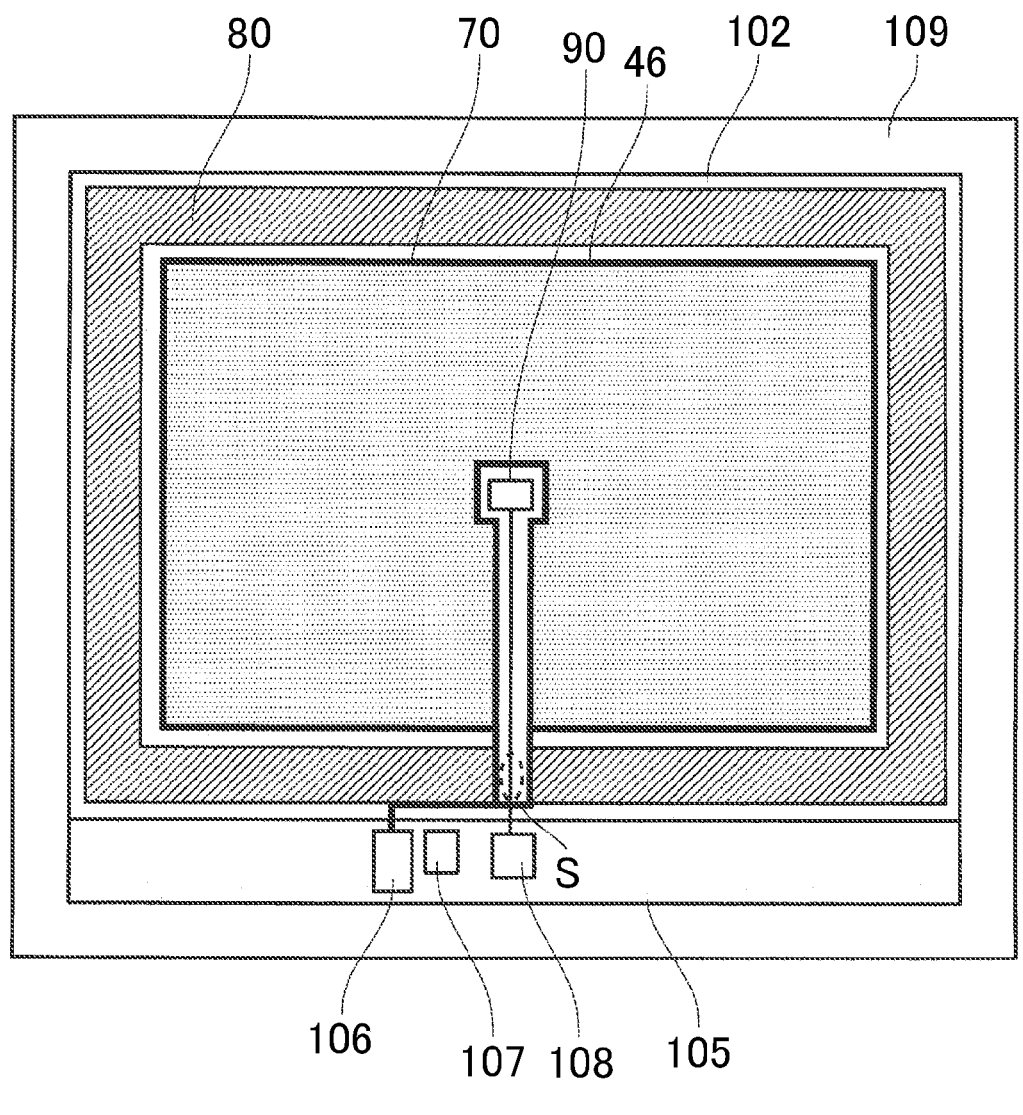
FIG. 10 illustrates an exemplary configuration of a semiconductor device 100 in accordance with Example 4.

FIG. 10 illustrates an exemplary configuration of a semiconductor device 100 in accordance with Example 4. The semiconductor device 100 of the present example shows an exemplary arrangement of a transistor section 70, a diode section 80 and a temperature sensor 90, of which an area or the like of each region may be changed as appropriate depending on required properties or the like.

The transistor section 70 is formed at the center of the active region 102. The center of the active region 102 may not exactly be a center of the active region 102, but the arrangement may include the transistor section 70 around which other regions such as the diode section 80 are formed. Also, the transistor section 70 in which the temperature sensor 90 is arranged at the center includes a concave portion through which wiring is provided to connect the temperature sensor 90 and a temperature detecting section 108. The transistor section 70 of the present example includes a gate runner 46 at the boundary between the temperature sensor 90 and the wiring. That is, the gate runner 46 is arranged along the concave portion of the transistor section 70.

The diode section 80 is formed to surround the transistor section 70. Although the diode section 80 of the present example is formed to have a uniform width, it may also have each side of varied widths. For example, the width of the diode section 80 is adjusted such that the transistor section 70 and the diode section 80 have a particular area ratio. Also, the diode section 80 includes an isolation region S to provide wiring for the temperature sensor 90.

Figure 11:
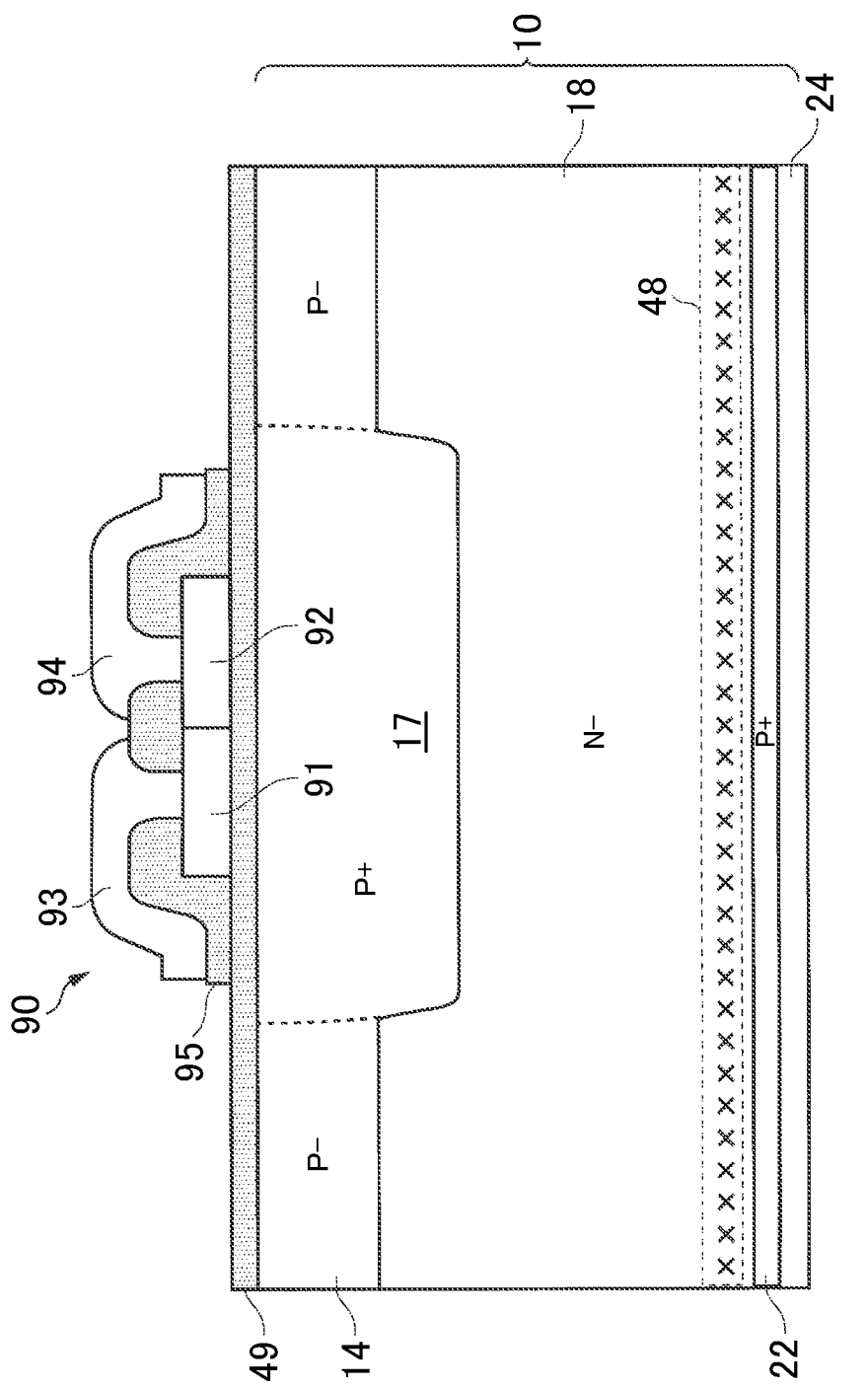
FIG. 11 illustrates an exemplary configuration of a temperature sensor 90.

FIG. 11 illustrates an exemplary cross section of the semiconductor device 100. In particular, the figure shows a cross section of a region in which the temperature sensor 90 is formed.

The temperature sensor 90 includes a PN diode. The temperature sensor 90 utilizes the current-voltage properties of the PN diode varied depending on the temperature to detect the temperature of the semiconductor device 100. The temperature sensor 90 is arranged, for example, above the semiconductor substrate 10 via a gate insulating film 49. More specifically, the temperature sensor 90 is formed above the well region 17. In this way, the temperature sensor 90 is formed above the well region 17 which is an invalid region not to operate as the transistor section 70, which allows an arrangement without narrowing the region of the transistor section 70. The temperature sensor 90 of the present example includes a first conductivity type region 91, a second conductivity type region 92, a first connection portion 93, a second connection portion 94 and an insulating film 95.

The first conductivity type region 91 and the second conductivity type region 92 configure the PN diode. For example, the first conductivity type region 91 is formed of N type semiconductor while the second conductivity type region 92 is formed of P type semiconductor.

The first connection portion 93 and the second connection portion 94 are electrically connected to the first conductivity type region 91 and the second conductivity type region 92, respectively. Also, the first connection portion 93 and the second connection portion 94 are electrically connected to the temperature detecting section 108 through wiring.

The insulating film 95 insulates the first connection portion 93 and the second connection portion 94 to prevent them from being electrically connected to a region other than the first conductivity type region 91 and the second conductivity type region 92, which needs not to be connected.

Example 5

Figure 12:
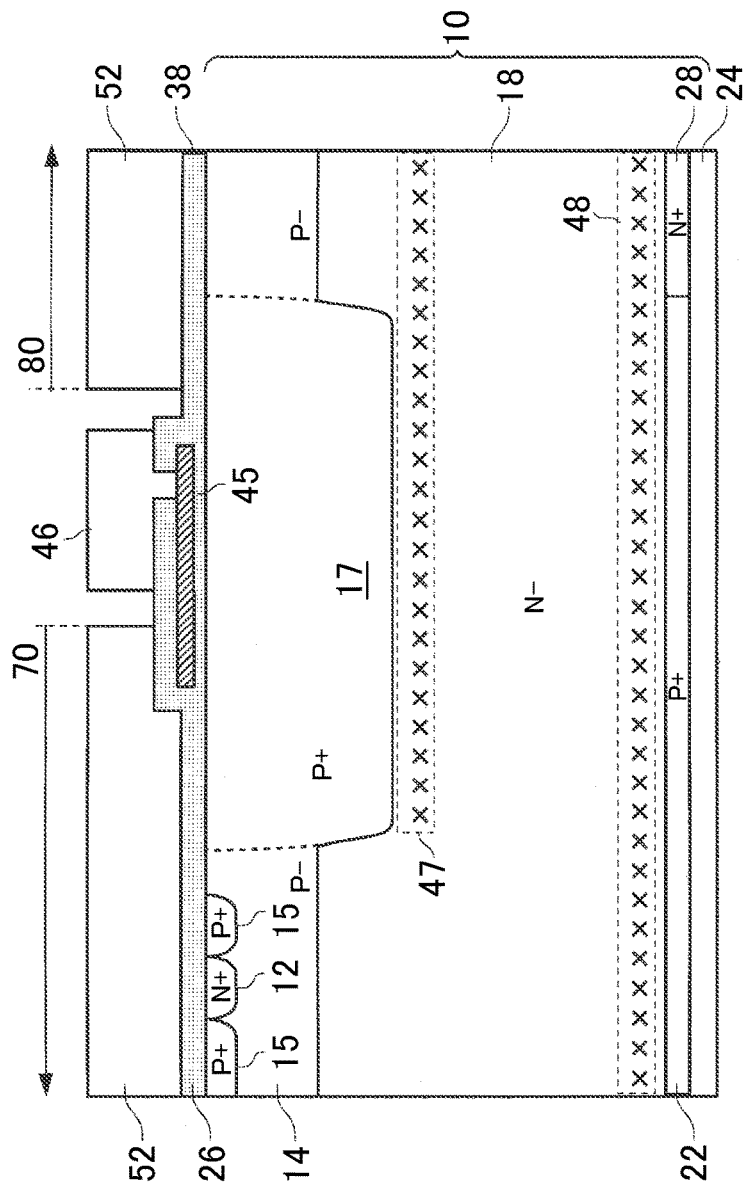
FIG. 12 illustrates an exemplary cross section taken along a-a' of a semiconductor device 100 in accordance with Example 5.

FIG. 12 illustrates an exemplary cross section taken along a-a' of a semiconductor device 100 in accordance with Example 5. The semiconductor device 100 of the present example shows an exemplary arrangement of a lifetime killer 47 and a collector region 22. Also, the semiconductor device 100 of the present example illustrates the cross section taken along a-a' of FIG. 2.

In an example, the lifetime killer 47 is provided in the entire region below a gate runner 46 at a front surface side of the semiconductor substrate 10. The semiconductor device 100 of the present example includes the lifetime killer 47 formed in the entire region below the gate runner 46, but not formed in a region at the transistor section 70 side, which inhibits deterioration of properties of the transistor section 70. Also, the lifetime killer 47 may be formed in the entire region below the well region 17. Also in this case, the lifetime killer 47 may not be formed in a region at the transistor section 70 side.

The collector region 22 is provided in the entire region below the gate runner 46. The collector region 22 of the present example is formed in the entire region below the gate runner 46, but is not provided in a region at the diode section 80 side. That is, the transistor section 70 and the cathode region 28 can be isolated without affecting the region of the diode section 80. Also, the semiconductor device 100 can inhibit a malfunction of the transistor section 70 affected by the cathode region 28.

The collector region 22 may also be provided in the entire region below the well region 17. Also in this case, the collector region 22 may not be provided in a region at the diode section 80 side.

The collector region 22 may be formed beyond a position on the back surface side corresponding to the end of the emitter electrode 52 formed in the diode section 80. This can inhibit influences of carriers of the diode section 80 which interrupt the transistor section 70 side.

Example 6

Figure 13:
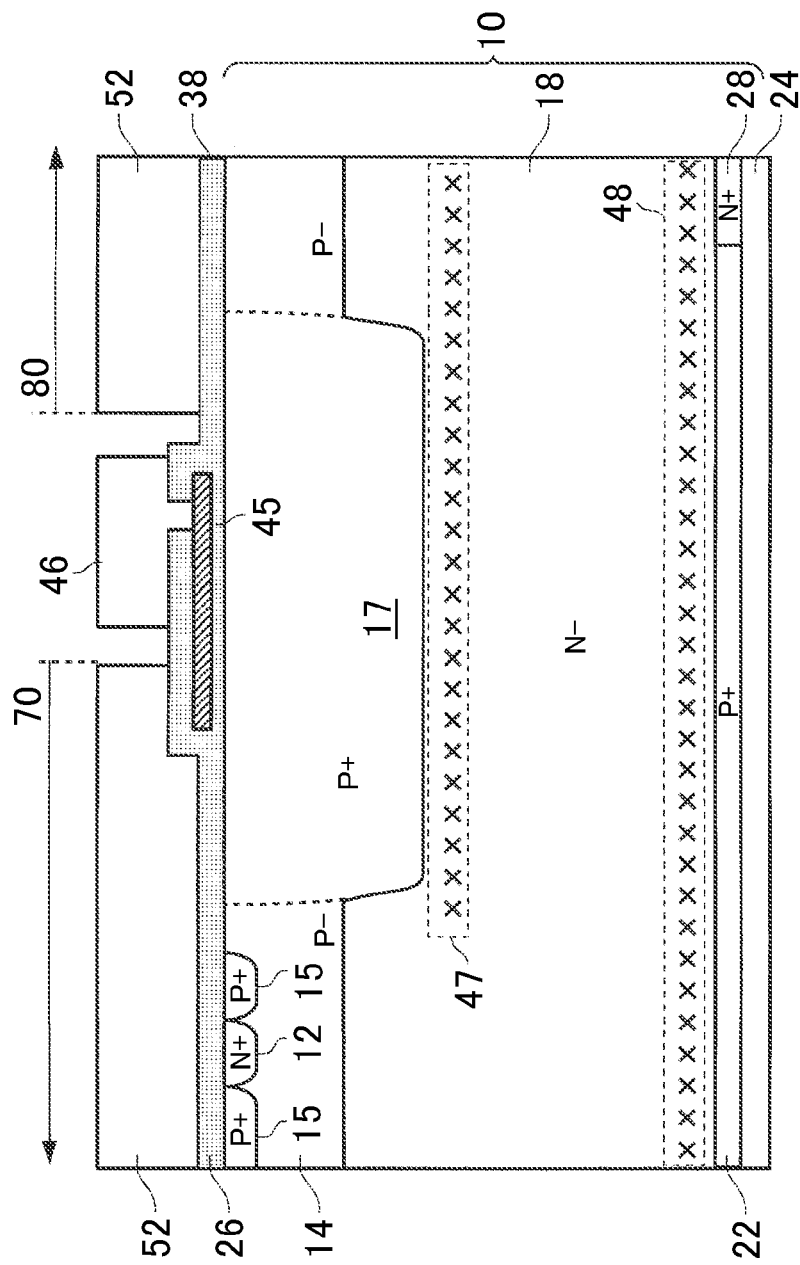
FIG. 13 illustrates an exemplary cross section taken along a-a' of a semiconductor device 100 in accordance with Example 6.

FIG. 13 illustrates an exemplary cross section taken along a-a' of a semiconductor device 100 in accordance with Example 6. The semiconductor device 100 of the present example shows an exemplary arrangement of a lifetime killer 47 and a collector region 22. Also, the semiconductor device 100 of the present example illustrates the cross section taken along a-a' of FIG. 2.

In an example, the lifetime killer 47 is provided in at least a portion at the transistor section 70 side. The lifetime killer 47 of the present example is also provided in the entire region below the gate runner 46 at a front surface side of the semiconductor substrate 10. That is, the lifetime killer 47 of the present example is formed to extend from the diode section 80 side to the transistor section 70. The semiconductor device 100 of the present example is provided with the lifetime killer 47 extending to the transistor section 70 side, which can inhibit a malfunction of the transistor section 70 affected by the cathode region 28.

The collector region 22 is provided in at least a portion of the diode section 80 side. Also, the collector region 22 is provided in the entire region below the gate runner 46. The cathode region 28 is not formed below the gate runner 46. That is, the cathode region 28 of the present example is formed more apart from the transistor section 70 side than in the semiconductor device 100 in accordance with Example 5. This further facilitates the semiconductor device 100 of the present example to inhibit a malfunction of the transistor section 70 affected by the cathode region 28. Also, the collector region 22 may be provided in at least a portion of the diode section 80 side and in the entire region below the well region 17.

Note that a position of an end of the lifetime killer 47 at the transistor section 70 side and a position of an end of the collector region 22 at the diode section 80 side can be arranged as appropriate in relation to the configuration in the foregoing. For example, the lifetime killer 47 may be formed such that its end at the transistor section 70 side is positioned in a portion below the gate runner 46 or the well region 17, as shown in FIG. 3. In addition, the collector region 22 may extend such that its end at the diode section 80 side is positioned in at least a portion of the diode section 80 side, as shown in FIG. 13. This results in the lifetime killer 47 sufficiently less affecting properties of the transistor section 70.

In addition, for example, the lifetime killer 47 may be formed to extend beyond from below the gate runner 46 or the well region 17 such that its end at the transistor section 70 side is positioned in a portion of the transistor section 70, as shown in FIG. 13. In addition, the collector region 22 may be formed such that its end at the diode section 80 side is positioned in a portion below the gate runner 46 or the well region 17, as shown in FIG. 3. This can inhibit minority carriers accumulated in a lower portion of the gate runner 46 or a lower portion of the well region 17 from the diode section 80 from affecting the transistor section 70 side.

Example 7

Figure 14:
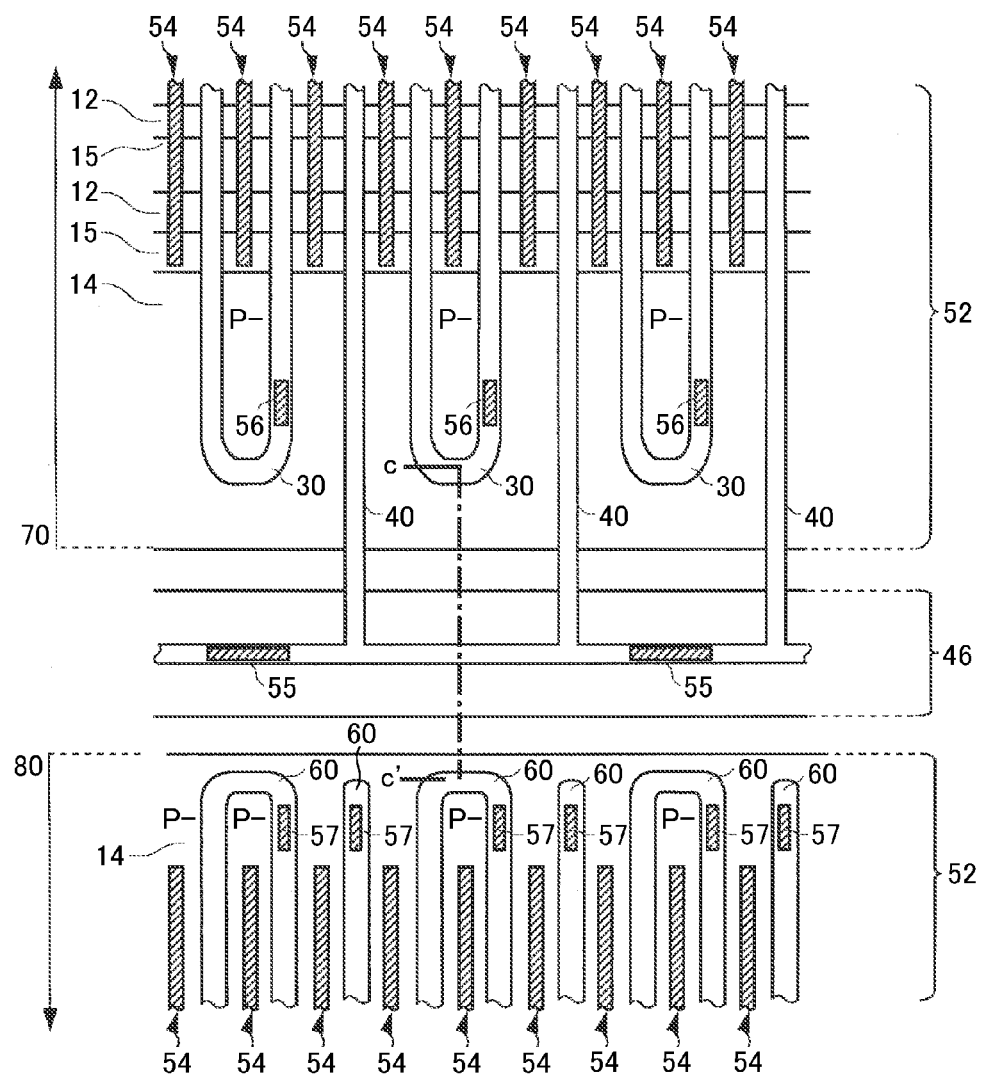
FIG. 14 is a plan view illustrating an exemplary semiconductor device 100 in accordance with Example 7.

FIG. 14 is a plan view illustrating an exemplary semiconductor device 100 in accordance with Example 7. The semiconductor device 100 of the present example has a structure in which a polysilicon layer embedded inside a gate trench section 40 via a gate insulating film is directly connected to the gate runner 46.

The transistor section 70 includes a dummy trench section 30 having a loop type shape and the gate trench section 40 having a linear shape. However, whether the dummy trench section 30 and the gate trench section 40 have a loop type shape or a linear shape, respectively, may be changed as appropriate.

The diode section 80 includes, as is the case with Example 1, an emitter trench section 60 having a loop type shape and a linear shape to correspond to a trench width of the dummy trench section 30 and the gate trench section 40. However, the shape of the emitter trench section 60 may be changed as appropriate depending on the layout of the transistor section 70 and the diode section 80.

The gate runner 46 is provided between the transistor section 70 and the diode section 80. The gate runner 46 of the present example is formed to have a linear shape.

The gate trench section 40 includes a region formed in parallel to an extending direction of gate runner 46 and a region formed in parallel to an extending direction of the dummy trench section 30. At least a portion of the gate trench section 40 is formed to be connected to the gate runner 46 via a contact hole 55. At least a portion of the gate trench section 40 may be formed below the gate runner 46.

Figure 15:
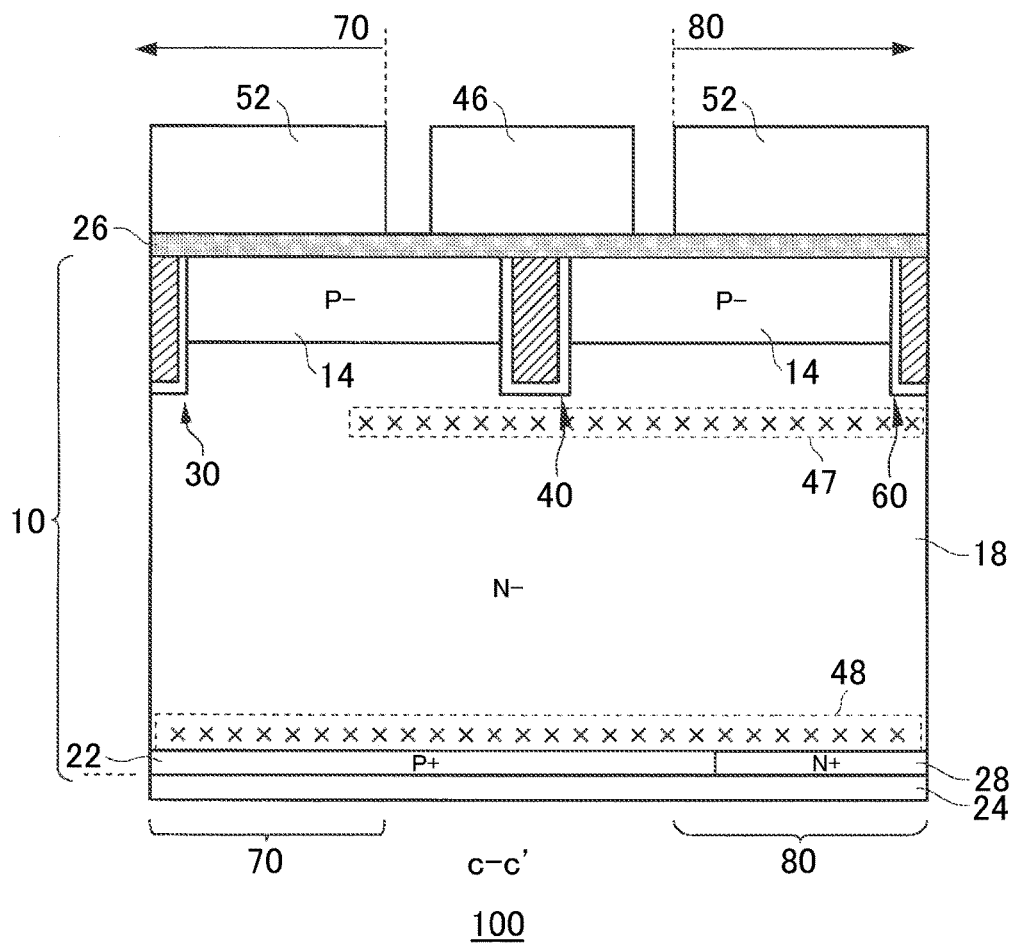
FIG. 15 illustrates an exemplary cross section taken along c-c' of the semiconductor device 100 in accordance with Example 7.

FIG. 15 illustrates an exemplary cross section taken along c-c' of the semiconductor device 100 in accordance with Example 7. The semiconductor device 100 of the present example includes the gate runner 46 between the transistor section 70 and the diode section 80, which can inhibit a malfunction of the transistor section 70 affected by the cathode region 28.

In an example, the lifetime killer 47 is provided in at least a portion at the transistor section 70 side. The lifetime killer 47 of the present example is also provided in the entire region below the gate runner 46 at a front surface side of the semiconductor substrate 10. That is, the lifetime killer 47 of the present example is formed to extend from the diode section 80 side to the transistor section 70. The semiconductor device 100 of the present example is provided with the lifetime killer 47 extending to the transistor section 70 side, which can inhibit a malfunction of the transistor section 70 affected by the cathode region 28.

Note that even if the gate trench section 40 is directly connected to the gate runner 46 as in the present example, the relationship of the lifetime killer 47 and the gate runner 46 may be set as appropriate, as shown in other Examples.

The collector region 22 may be formed beyond a position on the back surface side corresponding to the end of the emitter electrode 52 formed in the diode section 80. This can inhibit influences of carriers of the diode section 80 which interrupt the transistor section 70 side.

Example 8

Figure 16:
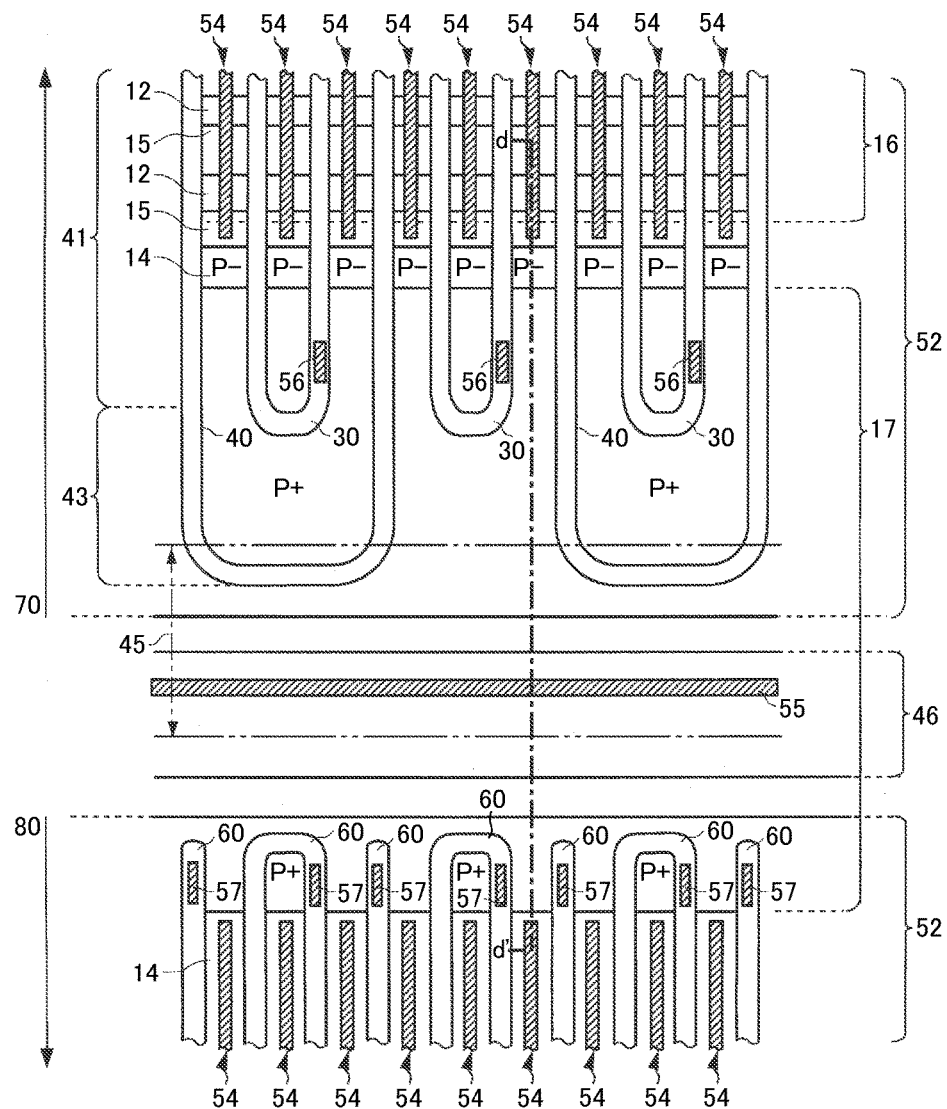
FIG. 16 is a plan view illustrating an exemplary semiconductor device 100 in accordance with Example 8.
Figure 17:
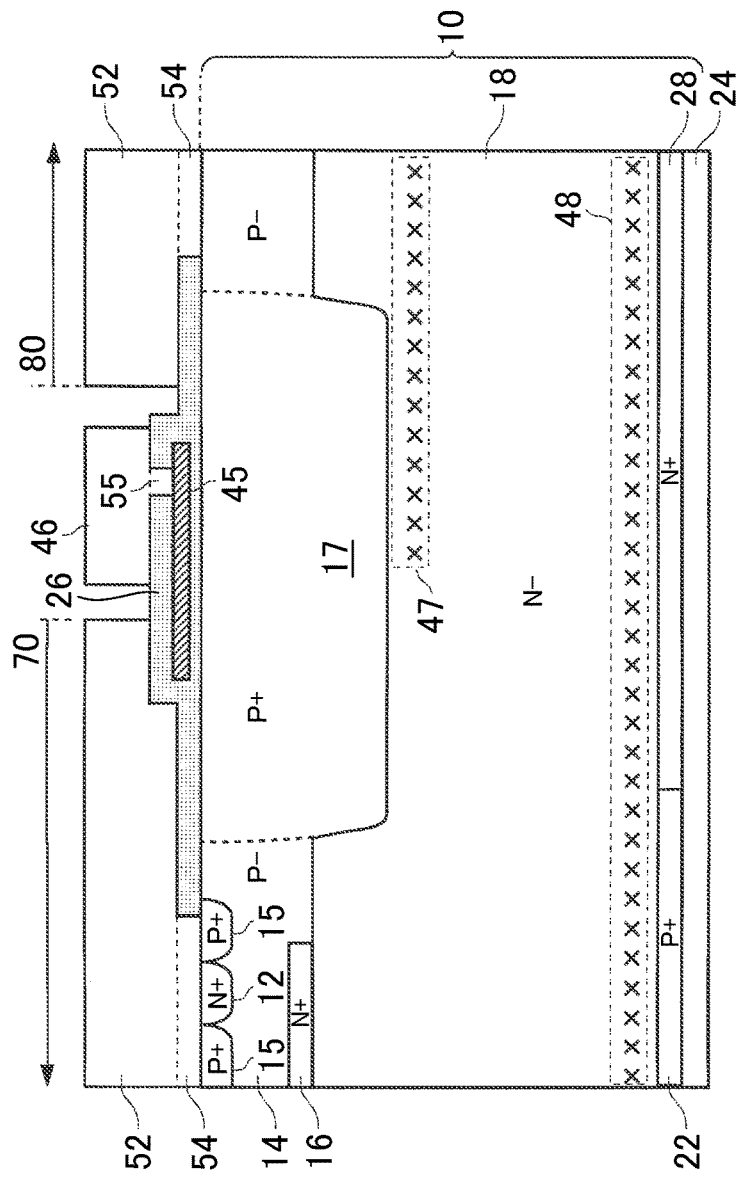
FIG. 17 illustrates an exemplary cross section taken along d-d' of the semiconductor device 100 in accordance with Example 8.

FIG. 16 is a plan view illustrating an exemplary semiconductor device 100 in accordance with Example 8. FIG. 17 illustrates an exemplary cross section taken along d-d' of the semiconductor device 100 in accordance with Example 8. The semiconductor device 100 of the present example further comprises an accumulating layer 16, in addition to the configuration of the semiconductor device 100 in accordance with Example 1.

The accumulating layer 16 is formed at the back surface side of the base region 14. The accumulating layer 16 is formed to have a higher concentration than an impurity concentration of the semiconductor substrate 10. More specifically, the accumulating layer 16 has a higher impurity concentration than an impurity concentration of the drift region 18. The accumulating layer 16 is formed between the adjacent trenches. In an example, the accumulating layer 16 has an impurity concentration of equal to or greater than $1E16$ $cm^{-3}$, and equal to or less than $1E18$ $cm^{-3}$. Note that E means a power of 10, and for example, $1E16$ $cm^{-3}$ means $1 \times 10^{16}$ $cm^{-3}$. For example, the accumulating layer 16 is formed by injecting N type impurities such as phosphorous from the front surface side of the semiconductor substrate 10. Providing the accumulating layer 16 inhibits holes injected from the collector region 22 to the drift region 18 in an ON state from flowing into the base region 14, which enhances the injection facilitation effect of electrons from the emitter region 12 to the base region 14. This results in the semiconductor device 100 having a reduced ON voltage.

Although the accumulating layer 16 of the present example is formed in the transistor section 70, it is not formed in the diode section 80. Also, the accumulating layer 16 is formed, in a planar view, to correspond to the region in which the contact hole 54 is formed. The accumulating layer 16 of the present example is formed inside the region in which the contact hole 54 is formed in the extending direction of the trench section included in the transistor section 70. This results in the semiconductor device 100 of the present example enhancing the carrier draw out effect of the accumulating layer 16, which inhibits decreases in capability. Also, preferably, at least a portion of an end portion of a trench section of the transistor section 70 is formed in the well region 17. This enhances the breakdown voltage of the semiconductor device 100.

Example 9

Figure 18:
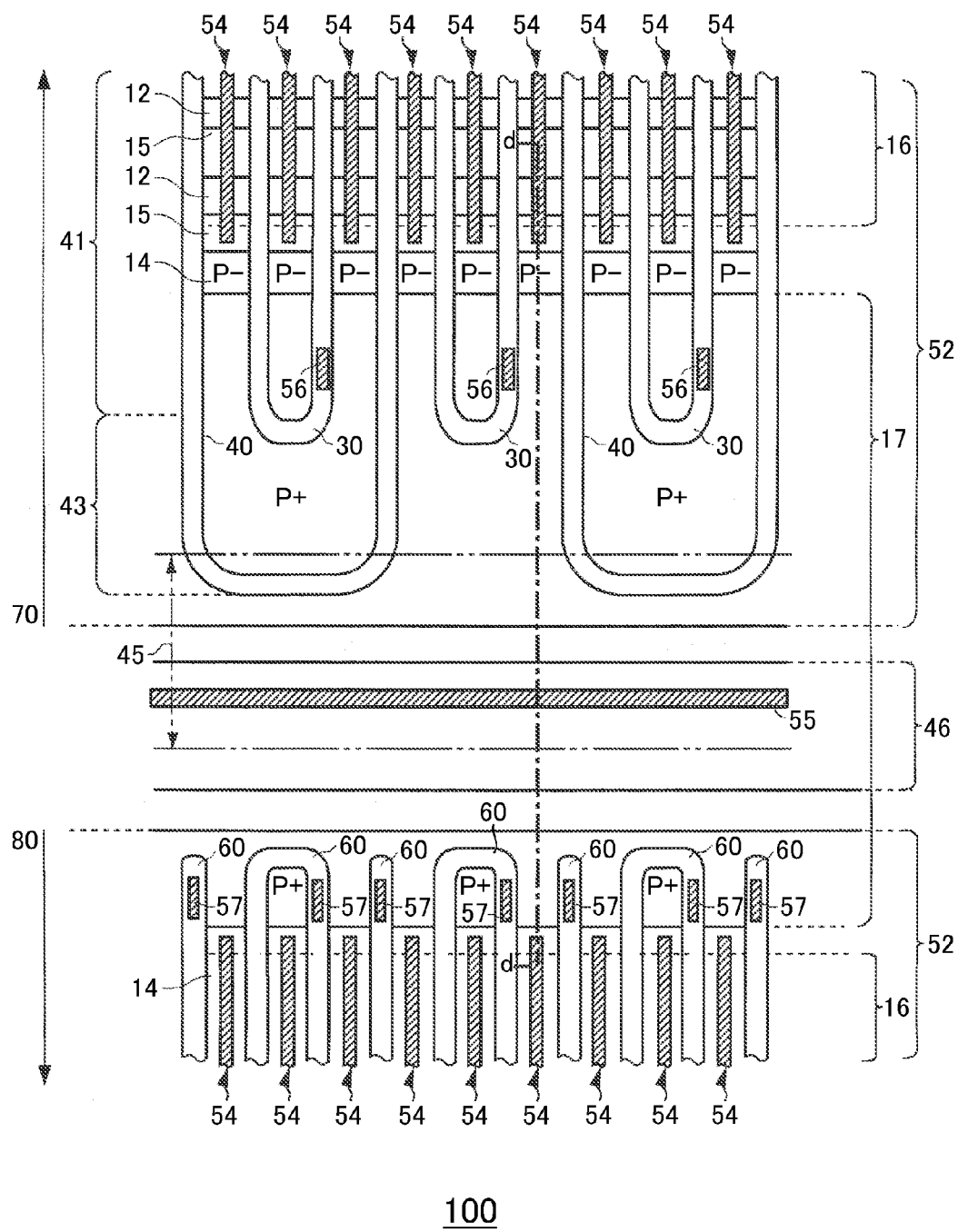
FIG. 18 is a plan view illustrating an exemplary semiconductor device 100 in accordance with Example 9.
Figure 19:
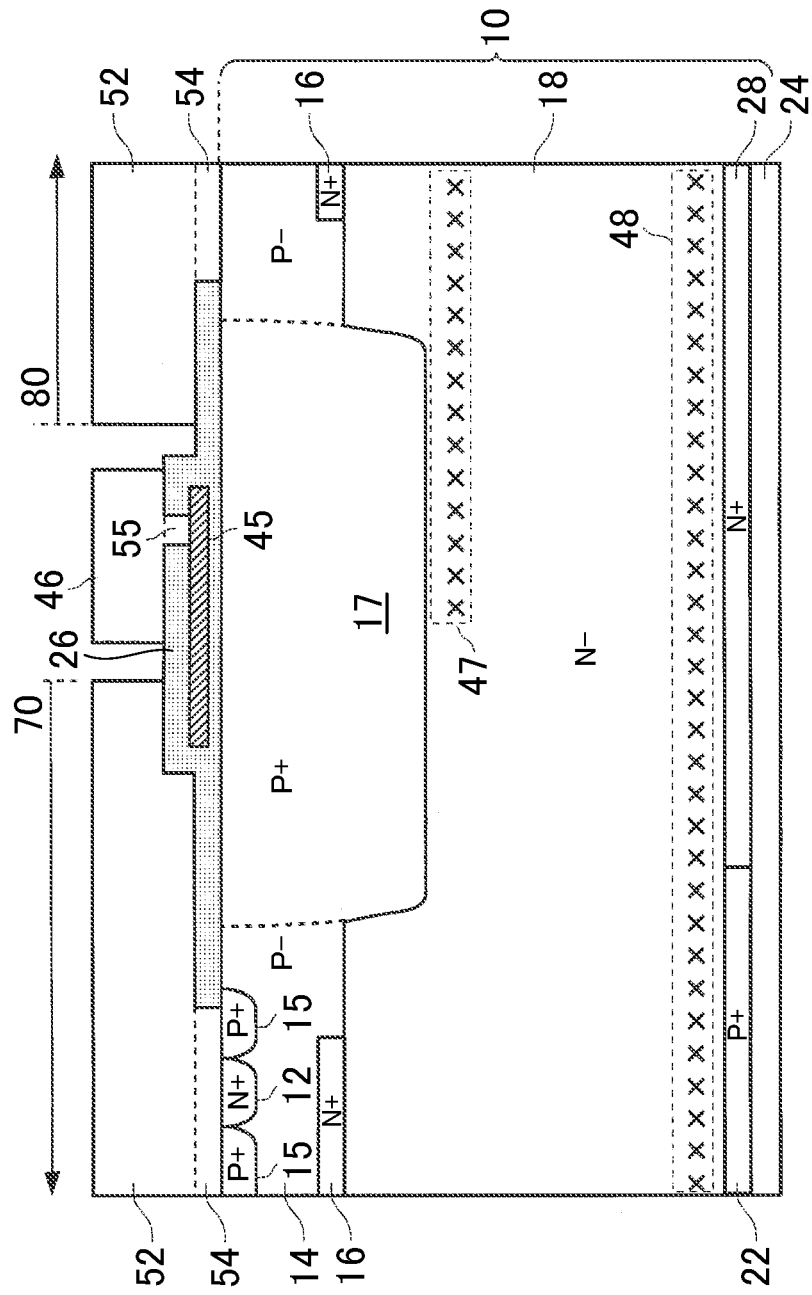
FIG. 19 illustrates an exemplary cross section taken along d-d' of the semiconductor device 100 in accordance with Example 9.

FIG. 18 is a plan view illustrating an exemplary semiconductor device 100 in accordance with Example 9. FIG. 19 illustrates an exemplary cross section taken along d-d' of the semiconductor device 100 in accordance with Example 9. The semiconductor device 100 of the present example further comprises an accumulating layer 16, in addition to the configuration of the semiconductor device 100 in accordance with Example 1.

The accumulating layer 16 of the present example is formed in both of the transistor section 70 and the diode section 80. However, the accumulating layer 16 is not formed in the well region 17. That is, the accumulating layer 16 is not formed in the region in which the gate runner 46 is formed. Also, the accumulating layer 16 is formed, in a planar view, to correspond to the region in which the contact hole 54 is formed. The contact hole 54 at the transistor section 70 side is formed, in a planar view, to be apart from the well region 17. Also, the contact hole 54 at the diode section 80 side is formed, in a planar view, to be apart from the well region 17.

The accumulating layer 16 of the present example is formed inside the region in which the contact hole 54 is formed in the extending direction of the trench section included in the transistor section 70. Also, similarly in the diode section 80, the accumulating layer 16 is formed inside the region in which the contact hole 54 is formed in the extending direction of the trench section included in the diode section 80. This results in the semiconductor device 100 of the present example enhancing the carrier draw out effect of the accumulating layer 16, which inhibits decreases in resistance. Note that the lifetime killer 47 at the front surface side may be omitted if the accumulating layer 16 is formed in the diode section 80.

Example 10

Figure 20:
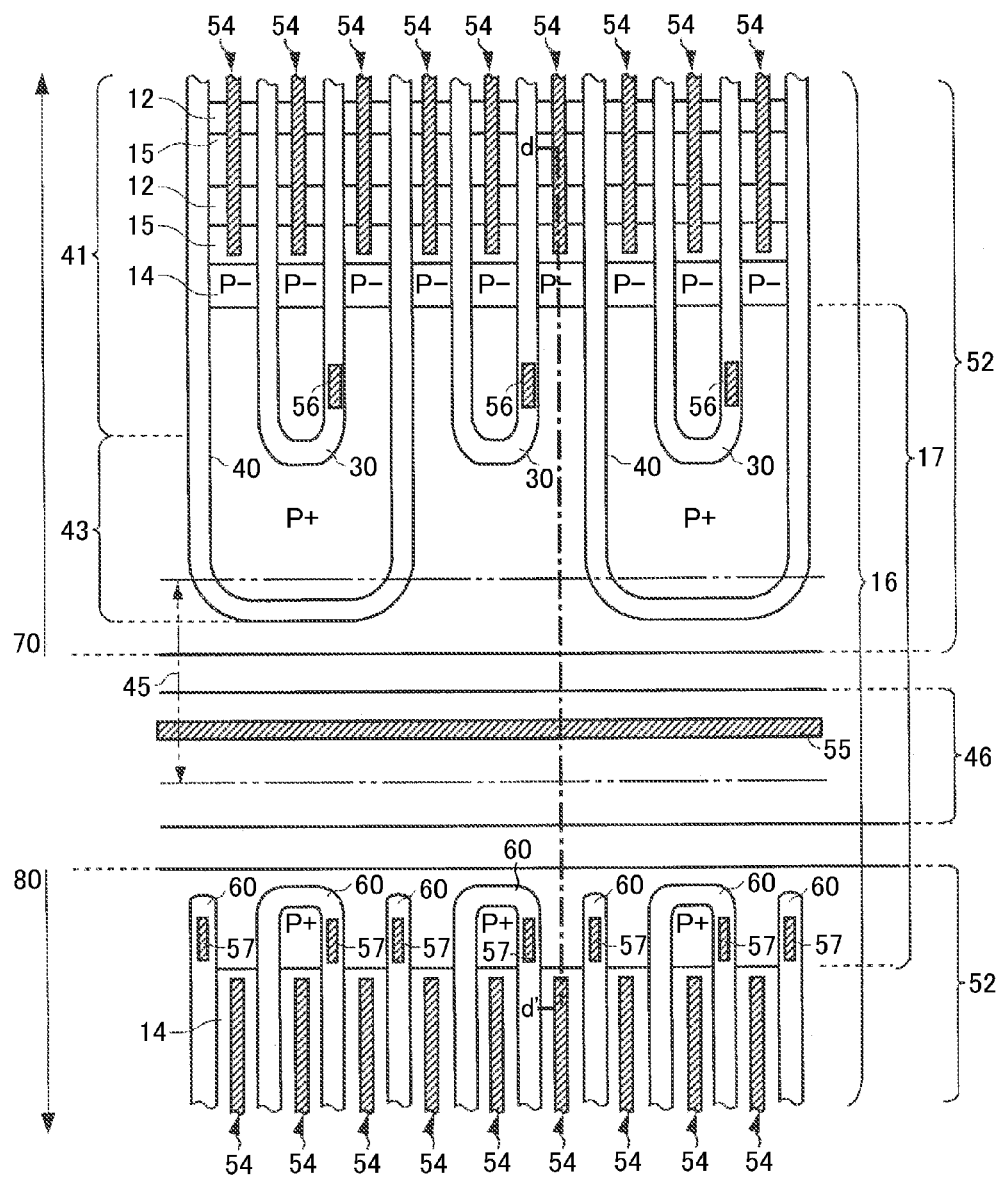
FIG. 20 is a plan view illustrating an exemplary semiconductor device 100 in accordance with Example 10.
Figure 21:
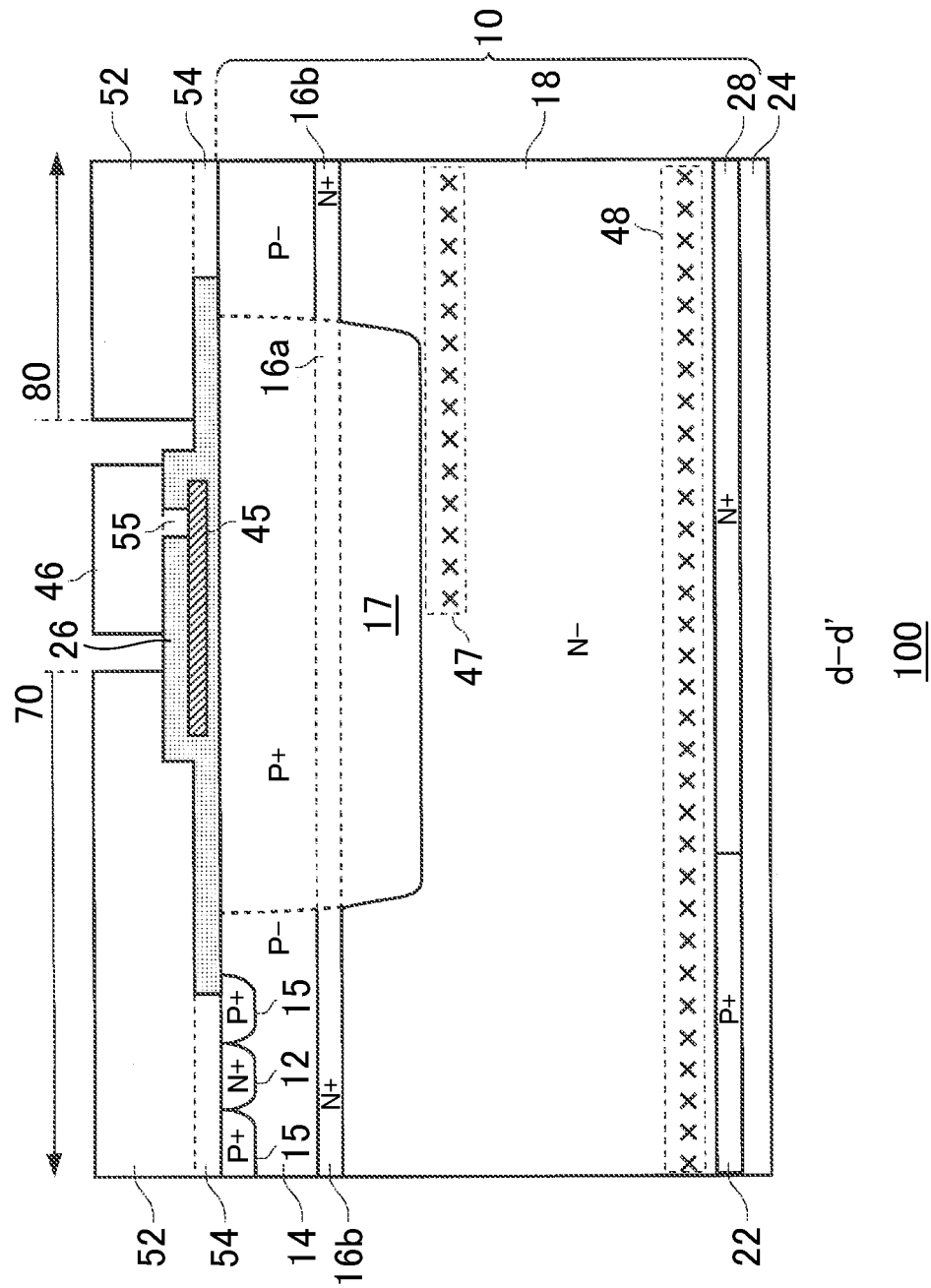
FIG. 21 illustrates an exemplary cross section taken along d-d' of the semiconductor device 100 in accordance with Example 10.

FIG. 20 is a plan view illustrating an exemplary semiconductor device 100 in accordance with Example 10. FIG. 21 illustrates an exemplary cross section taken along d-d' of the semiconductor device 100 in accordance with Example 10. The semiconductor device 100 of the present example further comprises an accumulating layer 16, in addition to the configuration of the semiconductor device 100 in accordance with Example 1.

The accumulating layer 16 of the present example is formed in both of the transistor section 70 and the diode section 80. Furthermore, at least a portion of the accumulating layer 16 of the present example is formed in the well region 17. That is, the accumulating layer 16 is also formed in the region in which the gate runner 46 is formed. Therefore, the accumulating layer 16 of the present example is formed in the region in which the transistor section 70, the diode section 80 and the gate runner 46 are formed. Referring now to the cross section view, the accumulating layer formed in the well region 17 is indicated as an accumulating layer 16a while the accumulating layer formed in a region other than the well region 17 is indicated as an accumulating layer 16b. The accumulating layer 16b is formed in the base region 14. The accumulating layer 16b is, as is the case with the accumulating layer 16 of Examples 8 and 9, a high concentration layer of N type. The accumulating layer 16a may not be of N type, unlike the accumulating layer 16b. That is, although the accumulating layer 16a may be formed through the same processes as the accumulating layer 16b, it is formed in the well region 17 and thus it may remain P type. Also, the accumulating layer 16a of the well region 17 may include an impurity of N type. The chemical concentration of N type impurities in the well region 17 is lower than the chemical concentration of P type impurities in the well region 17. This results in the semiconductor device 100 inhibiting decreases in the breakdown voltage and resistance. Note that the lifetime killer 47 at the front surface side may be omitted if the accumulating layer 16 is formed in the diode section 80.

Figure 22:
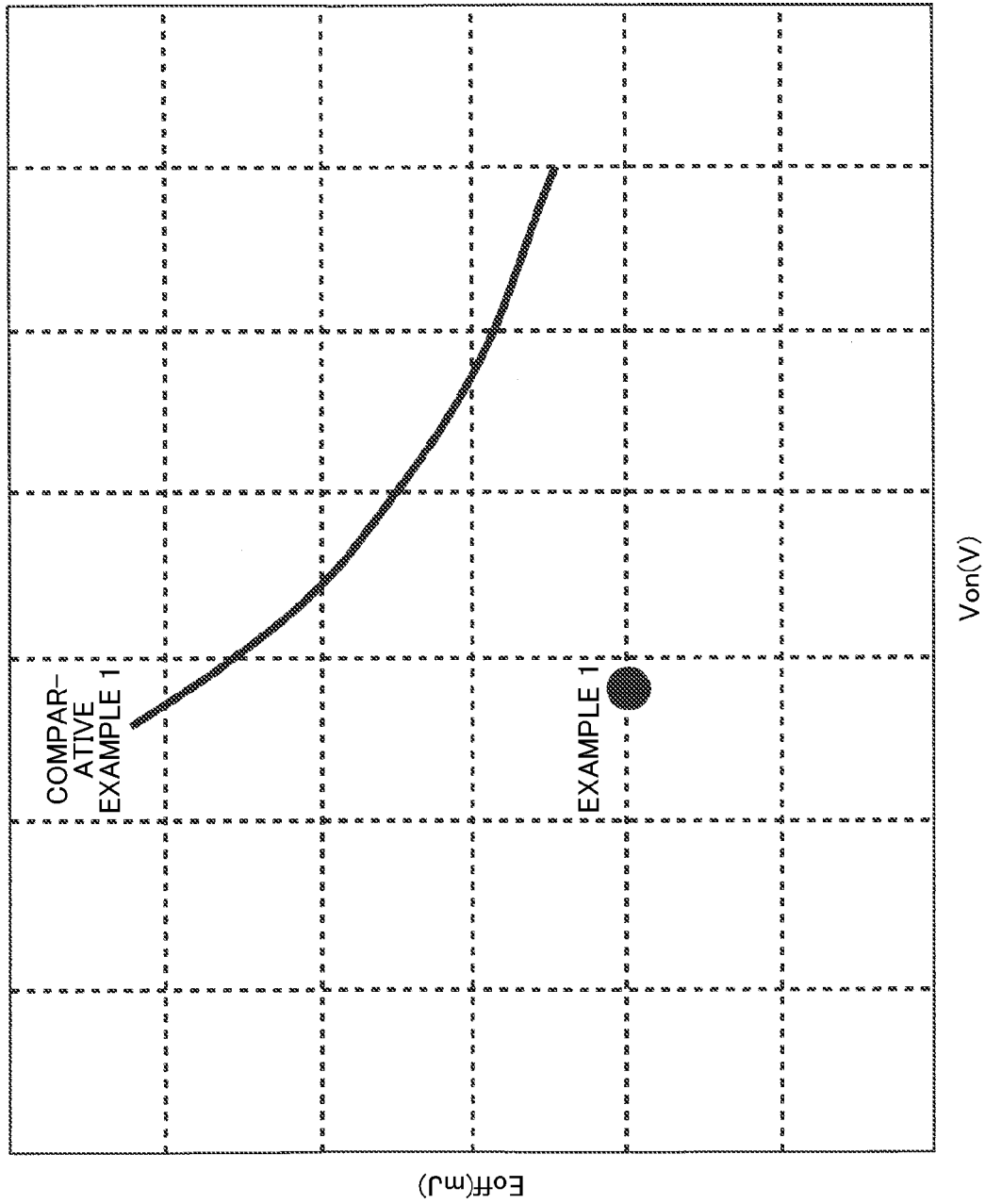
FIG. 22 illustrates the relationship between an ON voltage Von (V) and a turn off loss Eoff (mJ).

FIG. 22 illustrates the relationship between an ON voltage Von (V) and a turn off loss Eoff (mJ). In the semiconductor device 100 in accordance with Example 1, the turn off loss Eoff (mJ) is reduced compared to the semiconductor device 500 in accordance with Comparative Example 1. This results from the diode section 80 provided at the center, which reduces a region for introducing the lifetime killer at the front surface of the transistor section 70, thereby improving the tradeoff between the ON voltage Von (V) and the turn off loss Eoff (mJ).

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 15: contact region, 16: accumulating layer, 17: well region, 18: drift region, 22: collector region, 24: collector electrode, 26: interlayer insulating film, 28: cathode region, 30: dummy trench section, 40: gate trench section, 41: opposing section, 43: protruding section, 45: polysilicon layer, 46: gate runner, 47: lifetime killer, 48: lifetime killer, 49: gate insulating film, 52: emitter electrode, 54: contact hole, 55: contact hole, 56: contact hole, 57: contact hole, 60: emitter trench section, 70: transistor section, 80: diode section, 90: temperature sensor, 91: first conductivity type region, 92: second conductivity type region, 93: first connection portion, 94: second connection portion, 95: insulating film, 100: semiconductor device, 102: active region, 103: gate terminal, 105: outer region, 106: gate pad, 107: sensing unit, 108: temperature detecting section, 109: edge termination region, 500: semiconductor device, 510: semiconductor substrate, 512: emitter region, 514: base region, 515: contact region, 517: well region, 518: drift region, 522: collector region, 524: collector electrode, 526: interlayer insulating film, 530: dummy trench section, 540: gate trench section, 546: gate runner, 547: lifetime killer, 548: lifetime killer, 551: gate terminal, 552: emitter electrode, 553: emitter terminal, 554: contact hole, 555: contact hole, 556: contact hole, 557: contact hole, 560: emitter trench section, 570: transistor section, 580: diode section, 582: cathode region

What is claimed is:

1. A semiconductor device comprising:
   a semiconductor substrate;
   a transistor section formed on the semiconductor substrate;
   a diode section formed on the semiconductor substrate and including a lifetime killer at a front surface side of the semiconductor substrate; and
   a gate runner provided between the transistor section and the diode section and electrically connected to a gate of the transistor section,
   a well region having a conductivity type different from that of the semiconductor substrate and formed below the gate runner such that the well region overlaps the transistor section, the transistor section thereby having an overlapping region and a non-overlapping region,
   wherein the semiconductor substrate includes the lifetime killer in a substantially entire region below the gate runner at the front surface side of the semiconductor substrate.

2. The semiconductor device according to claim 1, wherein the semiconductor substrate includes the lifetime killer in an entire region at the front surface side of the semiconductor substrate and below the gate runner.

3. The semiconductor device according to claim 1, wherein the semiconductor substrate includes the lifetime killer in at least a portion at the front surface side of the semiconductor substrate and closer to the transistor section than to the gate runner.

4. The semiconductor device according to claim 1, wherein a collector region of the transistor section is formed in at least a portion below the gate runner.

5. The semiconductor device according to claim 1, wherein a collector region of the transistor section is formed in an entire region below the gate runner.

6. The semiconductor device according to claim 1, wherein a collector region of the transistor section is formed at least a portion closer to the diode section than to the gate runner.

7. The semiconductor device according to claim 1, wherein a cathode region of the diode section is not formed below the gate runner.

8. The semiconductor device according to claim 1, wherein
   the transistor section includes a gate trench section formed on the front surface of the semiconductor substrate, and
   at least a portion of the gate trench section is formed below the gate runner.

9. The semiconductor device according to claim 1, wherein the diode section is arranged at an end portion of an active region of the semiconductor device.

10. The semiconductor device according to claim 1, wherein the diode section is arranged at a corner portion of an active region of the semiconductor device.

11. The semiconductor device according to claim 1, wherein the diode section surrounds the transistor section in a planar view.

12. The semiconductor device according to claim 1, wherein the transistor section surrounds the diode section in a planar view.

13. The semiconductor device according to claim 1 further comprising:
    a temperature sensor provided adjacent to the transistor section to detect signals in response to a temperature of the transistor section; and
    a temperature sensor terminal electrically connected to the temperature sensor through a wiring for sensors, to which the signals detected by the temperature sensor are input.

14. The semiconductor device according to claim 13, wherein the diode section includes an isolation region to allow at least one of the gate runner and the wiring for sensors to traverse the diode section.

15. The semiconductor device according to claim 13, wherein the temperature sensor is arranged above a well region.

16. The semiconductor device according to claim 13, wherein the temperature sensor is surrounded by the transistor section.

17. The semiconductor device according to claim 13, wherein the diode section includes:
    a first diode region formed at one end of an active region of the semiconductor device; and
    a second diode region formed at the other end of the active region opposing to the one end.

18. The semiconductor device according to claim 17, wherein the temperature sensor is provided between the first diode region and the second diode region.

19. The semiconductor device according to claim 1 further comprising:
    an emitter region of a first conductivity type formed on the front surface of the semiconductor substrate;
    a base region of a second conductivity type which is different from the first conductivity type formed on the front surface of the semiconductor substrate;
    an accumulating layer of the first conductivity type formed at the front surface side of the semiconductor substrate and having a higher concentration than an impurity concentration of the semiconductor substrate; and
    an interlayer insulating film formed on the front surface of the semiconductor substrate;
    wherein the interlayer insulating film includes a contact hole corresponding to at least some regions of the emitter region and the base region and formed to penetrate the interlayer insulating film, and
    the accumulating layer is formed inside a region in which the contact hole is formed in an extending direction of a trench section included in the transistor section.

20. The semiconductor device according to claim 19, wherein the accumulating layer is formed inside a region in which the contact hole is formed in an extending direction of a trench section included in the diode section.

21. The semiconductor device according to claim 19, wherein the accumulating layer is formed in a region in which the transistor section, the diode section and the gate runner are formed.

22. The semiconductor device according to claim 19, wherein at least a portion of the accumulating layer is formed within a well region.

23. The semiconductor device according to claim 19, wherein the contact hole at the diode section side is formed to be apart from a well region in a planar view.

24. The semiconductor device according to claim 1, wherein at least a portion of an end portion of a trench section of the transistor section is formed within a well region.

25. The semiconductor device according to claim 1, wherein the semiconductor substrate does not include a lifetime killer in substantially the entire non-overlapping region of the transistor section at the front surface side of the semiconductor substrate.

26. The semiconductor device according to claim 1, wherein the diode section is a free wheel diode section.

27. The semiconductor device according to claim 1, further comprising
   an anode region formed at the front surface side of the semiconductor substrate; and
   a cathode region formed at the back surface side of the semiconductor substrate.

* * * * *